(12) United States Patent
Kladar et al.

(10) Patent No.: US 6,636,409 B2
(45) Date of Patent: Oct. 21, 2003

(54) SURGE PROTECTION DEVICE INCLUDING A THERMAL FUSE SPRING, A FUSE TRACE AND A VOLTAGE CLAMPING DEVICE

(75) Inventors: Dalibor Kladar, Calgary (CA); James Funke, Calgary (CA); Chi Thuong Ha, Calgary (CA); Anthony-Cernan Mendoza, Calgary (CA); Mieczyslaw Bandura, Calgary (CA); Mahoud Ghanem, Calgary (CA)

(73) Assignee: Eaton Corporation, Cleveland, OH (US)

( * ) Notice: Subject to any disclaimer, the term of this patent is extended or adjusted under 35 U.S.C. 154(b) by 230 days.

(21) Appl. No.: 09/836,888

(22) Filed: Apr. 16, 2001

(65) Prior Publication Data

US 2002/0149899 A1 Oct. 17, 2002

(51) Int. Cl.[7] ................................................. H02H 1/00
(52) U.S. Cl. ..................... 361/127; 361/104; 361/117
(58) Field of Search ............................... 361/127, 117, 361/104

(56) References Cited

U.S. PATENT DOCUMENTS

| 4,862,134 | A | 8/1989 | Poerschke et al. |
| 5,115,220 | A | 5/1992 | Suuronen et al. |
| 5,280,262 | A | 1/1994 | Fischer |
| 5,363,083 | A | 11/1994 | Fischer |
| 5,600,295 | A | 2/1997 | Kaufmann |
| 5,896,080 | A | 4/1999 | Chen |
| 6,067,216 | A | 5/2000 | Gröger |

OTHER PUBLICATIONS

Goldbach, W.7, "Dual–fuse™ Technology", *Innovative Technology, Inc.*, Oct. 5, 2000, 2 pp.
Hotchkiss, R.W. 7, "Vanguard™ Design Features", *Innovative Technology, Inc.*, Oct. 5, 2000, 2 pp.

Primary Examiner—Gregory J. Toatley, Jr.
Assistant Examiner—Isabel Rodriguez
(74) Attorney, Agent, or Firm—Martin J. Moran

(57) ABSTRACT

A surge protection device includes terminals adapted to receive a power source voltage and surge protection circuits, each of which includes a thermal fuse spring, one or more metal oxide varistors (MOVs), and one or more fuse traces corresponding to the MOVs. The thermal fuse spring, one of the fuse traces and the corresponding one of the MOVs are electrically interconnected in series between the terminals, in order to form a series electrical connection therebetween. The thermal fuse spring is adapted to disconnect the series electrical connection between the terminals under first fault conditions including a first current of first duration through one of the MOVs. The thermal fuse spring and each of the fuse traces are adapted to cooperatively disconnect a corresponding one of the series electrical connections between the terminals under second fault conditions including a second greater current of second lesser duration through one of the MOVs.

18 Claims, 13 Drawing Sheets

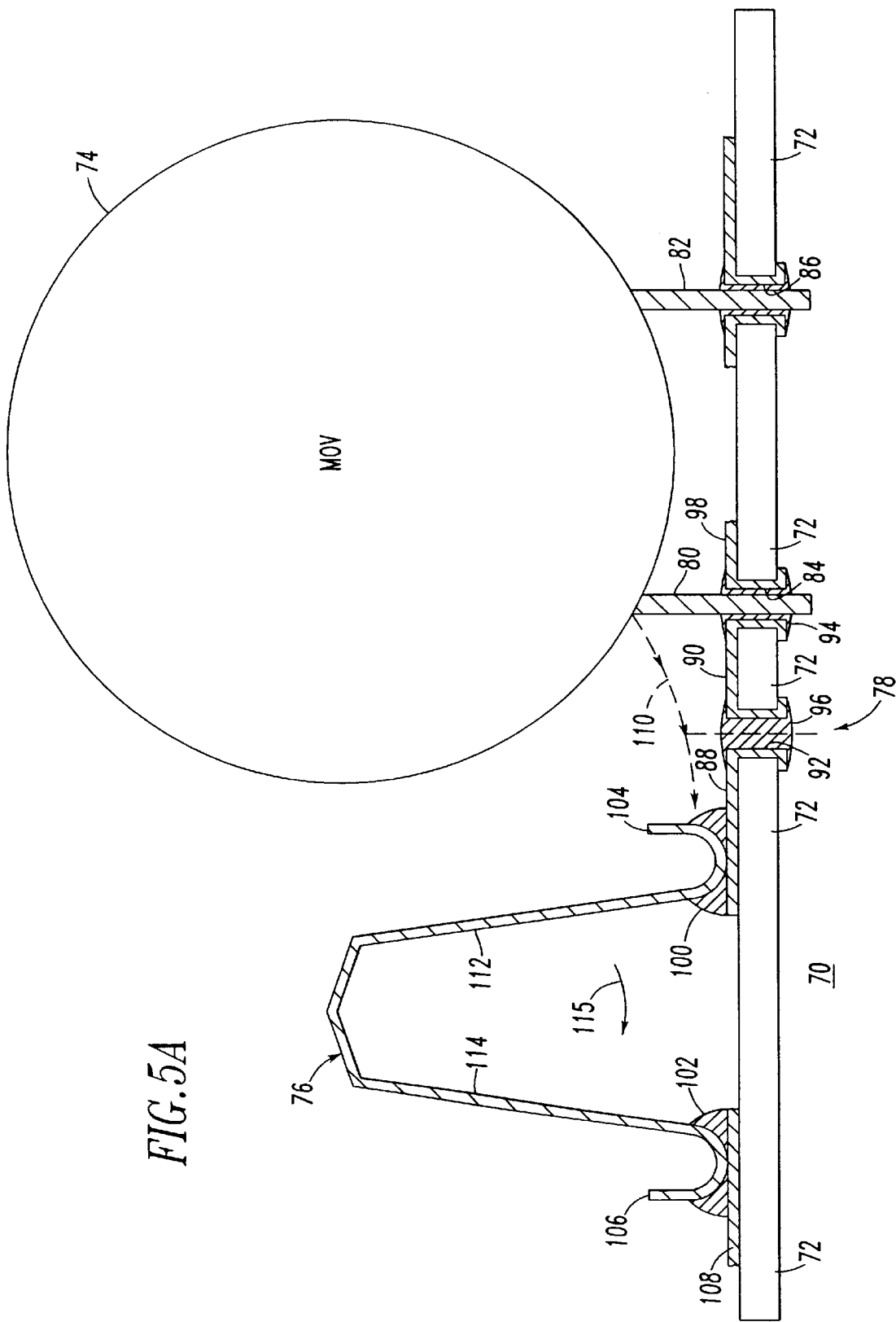

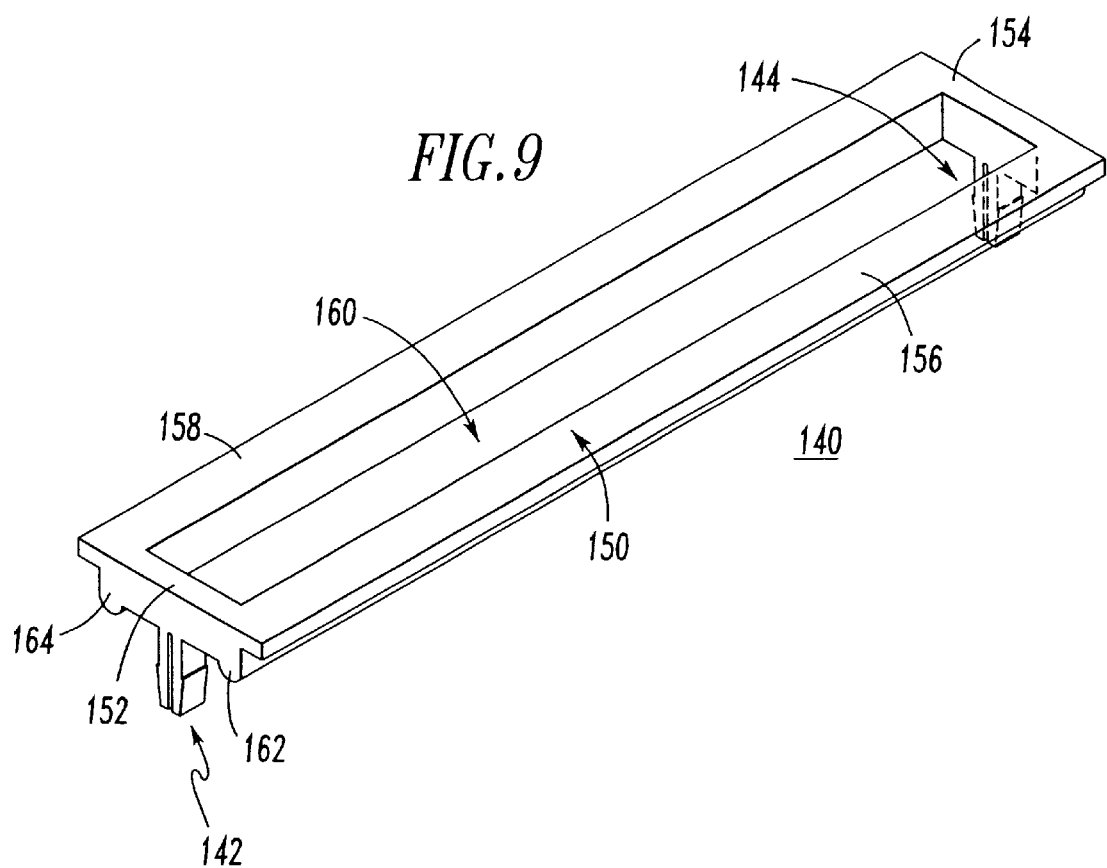
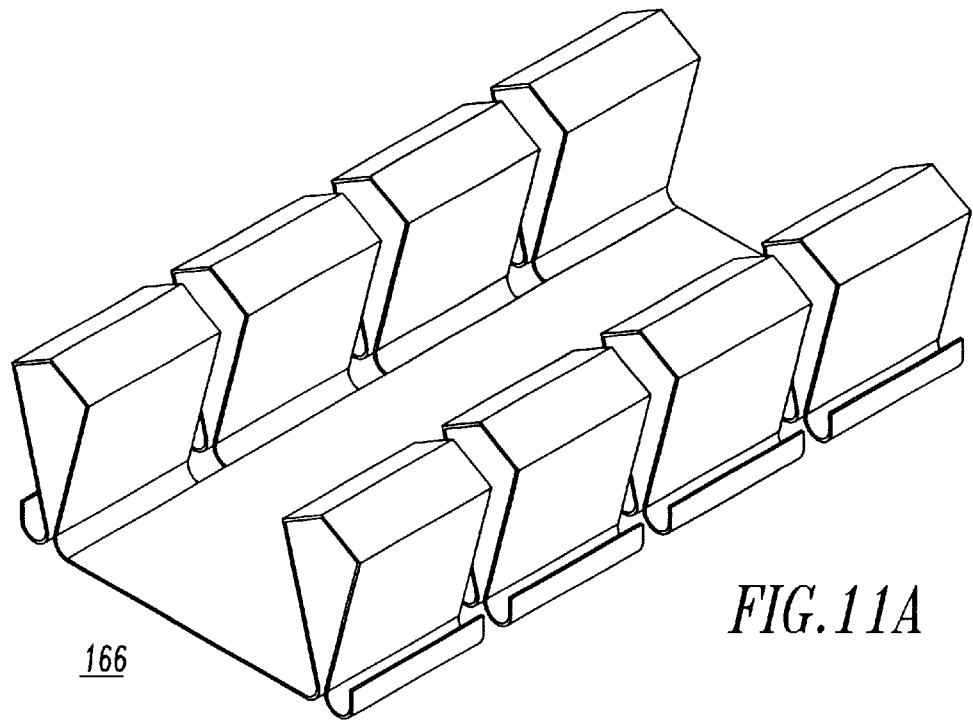

US 6,636,409 B2

SURGE PROTECTION DEVICE INCLUDING A THERMAL FUSE SPRING, A FUSE TRACE AND A VOLTAGE CLAMPING DEVICE

BACKGROUND OF THE INVENTION

1. Field of the Invention

This invention relates generally to apparatus for protecting a facility and its loads from surges and other disturbances in supply voltage and, more particularly, to a surge protection device such as, for example, an alternating current (AC) surge protective device (SPD) for such loads. The invention also relates to devices and methods for manufacturing a thermal fuse spring.

2. Background Information

Various devices and arrangements are known for protecting loads from surges in supply voltage. Generally, two approaches are used: series and parallel protection. In series protection, a high impedance is used in series with the load during a surge to block or limit surge current. In parallel protection, the surge current is diverted with a low impedance shunt. The present invention provides parallel protection.

It is known to use voltage clamping devices and crowbar devices to provide parallel surge protection. The voltage clamping devices clamp the voltage across the load to a specified level. Common types of clamping devices include metal oxide varistors (MOVs), zener diodes and silicon avalanche diodes. If used alone to provide parallel protection, an MOV, for example, must have a clamping voltage that is above the nominal supply voltage in order that its maximum continuous operating voltage (MCOV) is above the nominal supply voltage. Known crowbar devices include gas discharge tubes and thyristors. These devices normally have a high impedance and switch to a low impedance when a surge in the supply voltage exceeds the breakdown voltage of the gas in the case of the gas discharge tube, or is high enough to activate a trigger circuit to turn the thyristor on.

FIG. 1 shows a prior proposal for a surge protection device (SPD) circuit in which thermal disconnection of a failing MOV is used. The SPD 2 includes a conventional overcurrent fuse 4, three MOVs 6,8,10, and two thermal cut-off(TCO) devices 12,14. The SPD 2 is employed in a conventional AC power circuit 16 including a power input 18 having phase 20, neutral 22, and ground 24 connections, and a power output 26 having phase 28, neutral 30, and ground 32 connections. A circuit breaker or fuse is typically employed upstream from the SPD 2, in order to protect against a fatal failure of the SPD. For example, a circuit breaker or switch 34 is electrically connected in series between the phase input connection 20 and the phase output connection 28.

There are several disadvantages of this prior proposal. First, the reaction time is relatively long. The metal cases of the TCOs 12,14 are warmed by heat generated by the MOVs 6,8,10, with heat transfer from MOV to TCO being provided by radiation through the air. Because air and the MOV coatings are thermal isolators, it takes time for the TCOs to disconnect the MOVs during an abnormal condition of the SPD 2. Second, the surge current rating of the TCOs 12,14 is also a limiting factor. One TCO is typically suitable for only one MOV. Third, the major disadvantage is cost, since one TCO costs several times more than the corresponding MOV, which is to be protected. In order to improve the cost ratio, it is known to employ a combination of a plural MOVs connected in parallel in combination with a single TCO. However, in that case, the TCO does not have a surge current capability equivalent to that of the parallel connected MOVs.

FIG. 2 shows a SPD 36 including a plurality of MOVs 38, which are electrically interconnected in parallel. Each of the MOVs 38 is electrically connected in series with a corresponding one of the fuses 40 in order to provide individual overcurrent protection. Each of the fuses 40 is intended to open circuit when the corresponding MOV 38 fails and electrical current flowing through that fuse exceeds the current rating thereof. However, that current rating might not be suitable to prevent fire on the corresponding MOV 38 in the event that the surge rating of the corresponding fuse 40 exceeds the surge current rating of that MOV. For example, in the event of a catastrophic failure of one or more of the MOVs 38, the SPD 36, and perhaps the protected load (not shown), might be subject to substantial damage from fire and/or explosion. Degradation of MOVs might occur due to various reasons, which might lead to such a catastrophic failure of the SPD. Although this rarely happens, the end user must be protected.

A relatively high surge-rated SPD usually has plural MOVs connected in parallel in order to share surge currents. A failure of MOVs is extremely rare, but it is catastrophic when it occurs. The reasons for such failures are most often due to abnormal overvoltage (e.g., up to about 200% of nominal voltage) or surges.

There are several known proposals for fusing of MOVs in SPDs. For example, it is known to employ a fuse trace (FT) copper conductor on a printed circuit board (PCB) in series with a single MOV, or overcurrent protection per phase (e.g., a standard RK5 fuse, fuse resistor, block fuse, TCO, thermal fuse, surge fuse). However, such fuse traces are functional only up to certain levels of surge current. For example, known fuse traces cannot handle relatively higher surges (e.g., higher than about 6.5 kA) and still remain suitable for disconnecting a failing MOV at a fault condition (e.g., a fault current of less than about 10 A). This presents two opposite requirements for fuse trace design. First, in order to handle relatively higher surge currents, a fuse trace must have a cross-sectional area which is as large as possible. Second, in order to disconnect a failing MOV in a relatively short time, a fuse trace must have as small of a cross-sectional area as possible. Overcurrent protection, alone, is insufficient to meet these two requirements.

Recently, MOV surge ratings are increasing to relatively higher levels. For example, several years ago, 20 mm MOVs were rated up to about 6.5 kA (with a 8×20 µs standard waveform). Today, 20 mm MOVs are rated up to about 18 kA surge current.

U.S. Pat. No. 4,862,134 discloses an electrical fuse including a fusible conductor welded or bonded onto separated contact surfaces.

U.S. Pat. No. 6,067,216 discloses a circuit arrangement for protecting an electrical component from an undesirable electrical potential. The circuit arrangement includes a protective element, such as a diode, varistor or thyristor, in parallel with the electrical component. When a protective action occurs in response to an inadmissible voltage surge, the protective element, such as a surface mounted diode, experiences breakdown and becomes shorted which causes the fuse to open shortly thereafter. Also, the solder mounting the diode becomes liquefied as a result of heating of the diode. A divided pair of soldering pads is employed for one of the connections to the diode, which results in a more rapid rise of temperature than on an undivided soldering pad for the other connection to the diode.

U.S. Pat. Nos. 5,600,295 and 5,896,080 disclose thermal fuses for circuit substrates and printed circuit boards.

Generally, fusing in SPDs can be internal or external (e.g. inside the SPD enclosure, or circuit breakers and fuses outside the SPD enclosure).

There is a need for improvement of the fusing function in surge protection devices.

SUMMARY OF THE INVENTION

A surge protection device includes plural voltage clamping means, such as MOVs, accompanied by a thermal fuse spring and a fuse trace. Preferably, the three components are coordinated in terms of MOV (pre-fault) leakage current, MOV fault current, and MOV surge current rating for safe disconnection of the MOVs under certain failure conditions, such as overvoltage or surge.

As one aspect of the invention, a surge protection device for a load supplied with at least one voltage from a power source comprises: at least two terminals adapted to receive the voltage; and a plurality of surge protection circuits, each of the surge protection circuits comprising: a thermal fuse spring, at least one means for clamping a voltage, and at least one fuse trace, each one of the at least one fuse trace corresponding to one of the at least one means for clamping a voltage, with the thermal fuse spring, one of the at least one fuse trace and a corresponding one of the at least one means for clamping a voltage being electrically interconnected in series between the terminals, in order to form at least one series electrical connection between the terminals, with the thermal fuse spring being adapted to disconnect the at least one series electrical connection between the terminals under first fault conditions of the at least one means for clamping a voltage, the first fault conditions including a first current through one of the at least one means for clamping a voltage for a first duration, with the thermal fuse spring and the at least one fuse trace being adapted to cooperatively disconnect a corresponding one of the at least one series electrical connection between the terminals under second fault conditions of the at least one means for clamping a voltage, the second fault conditions including a second current through one of the at least one means for clamping a voltage for a second duration, with the second current being greater than the first current, and with the first duration being greater than the second duration.

The at least one means for clamping a voltage may be a metal oxide varistor having a catastrophic failure state under overvoltage conditions, and the at least one fuse trace may be a fuse trace. Each of the thermal fuse spring and the fuse trace has a time versus current characteristic which is coordinated with the catastrophic failure state of the metal oxide varistor in order to disconnect the metal oxide varistor from the voltage under the overvoltage conditions. At least one of the thermal fuse spring and the fuse trace disconnects the metal oxide varistor from the voltage in order to prevent the catastrophic failure state under the overvoltage conditions.

The surge protection circuits may include a printed circuit board. The fuse trace may include a first conductive trace on the printed circuit board, a conductive through hole in the printed circuit board, and a second conductive trace on the printed circuit board, with the first conductive trace being electrically connected to the input of the fuse trace and to the conductive through hole, and with the second conductive trace being electrically connected to the conductive through hole and to the output of the fuse trace.

Preferably, the conductive through hole of the fuse trace is filled with solder, in order to shorten a disconnection time of the fuse trace during an overcurrent condition. The solder may have a melting temperature of between about 175 degrees C. and about 250 degrees C.

The surge protection circuits may include a printed circuit board having a first conductor, which is electrically connected to one of the terminals, and a second conductor, which is electrically interconnected with the input of the fuse trace. The first spring member of the thermal fuse spring may be soldered to the first conductor of the printed circuit board and the second spring member of the thermal fuse spring may be stretched away from the first spring member and soldered to the second conductor of the printed circuit board.

Preferably, the first and second spring members of the thermal fuse spring are each soldered to the printed circuit board with a solder having a melting temperature of about 80 degrees C. to about 120 degrees C.

As another aspect of the invention, a method of manufacturing a thermal fuse spring comprises: cutting a flexible conductive material to form a base and a plurality of fingers; bending the base and the fingers to form a plurality of thermal fuse spring elements having a common base and a plurality of independent leg elements; stretching each of the leg elements away from the common base; positioning the common base and the stretched leg elements on a printed circuit board; and soldering the common base and the stretched leg elements to the printed circuit board.

As a further aspect of the invention, a stretcher device is for use in mounting at least one thermal fuse spring on a printed circuit board. The thermal fuse spring includes a spring member having a pair of legs each of which has a hooked foot member. The stretcher device comprises: a base including first and second ends, first and second sides, and an elongated opening in the base; a first alignment member affixed to the first end of the base; a second alignment member affixed to the second end of the base; a first elongated arcuate member affixed to the first side of the base; and a second elongated arcuate member affixed to the second side of the base, with the opening of the base adapted to receive the spring member of the thermal fuse spring, and with the first and second elongated arcuate members adapted to hold the hooked foot members of the thermal fuse spring with the legs thereof being stretched thereapart for engagement with the printed circuit board.

As another aspect of the invention, a surge protection device for a load supplied with a voltage from a power source comprises: a plurality of terminals adapted to receive the voltage; a printed circuit board; and a plurality of surge protection circuits, each of the surge protection circuits comprising: a thermal fuse spring on the printed circuit board, means for clamping a voltage, a fuse trace electrically interconnected in series with the thermal fuse spring and the means for clamping a voltage between the terminals, in order to form a series electrical connection between the terminals, the fuse trace including at least one conductive trace on the printed circuit board and also including a conductive through hole in the printed circuit board and electrically connected to the at least one conductive trace, and with the thermal fuse spring being adapted to disconnect the series electrical connection between the terminals under first fault conditions of the means for clamping a voltage, and with the thermal fuse spring and the fuse trace being adapted to cooperatively disconnect the series electrical connection between the terminals under second fault conditions of the means for clamping a voltage.

BRIEF DESCRIPTION OF THE DRAWINGS

A full understanding of the invention can be gained from the following description of the preferred embodiments when read in conjunction with the accompanying drawings in which:

FIG. 5A is a cross sectional view of a printed circuit board (PCB) SPD employing the combination of a MOV, a thermal fuse spring (TFS) and a fuse trace with solder hole (FTWSH) in accordance with an embodiment of the present invention.

FIG. 9 is an isometric view of a stretching tool for the un-stretched thermal fuse spring (TFS) of FIG. 8A in accordance with an embodiment of the present invention.

FIGS. 11A and 11B are isometric views of respective un-stretched and stretched thermal fuse springs (TFSs) in accordance with another embodiment of the present invention.

DESCRIPTION OF THE PREFERRED EMBODIMENTS

The present invention deals with internal fuses for SPDs and provides a combination of thermal disconnection and overcurrent protection, in which pre-fault current, fault current and surge current are coordinated through all three SPD components (e.g., MOV, thermal fuse spring (TFS), fuse trace (FT)). The TFS and the FT together protect the MOV in the event of fault conditions. Of significance, the FT increases the available interruptive current (AIC) (i.e., maximum fault current) rating of the SPD device.

Figure 1:
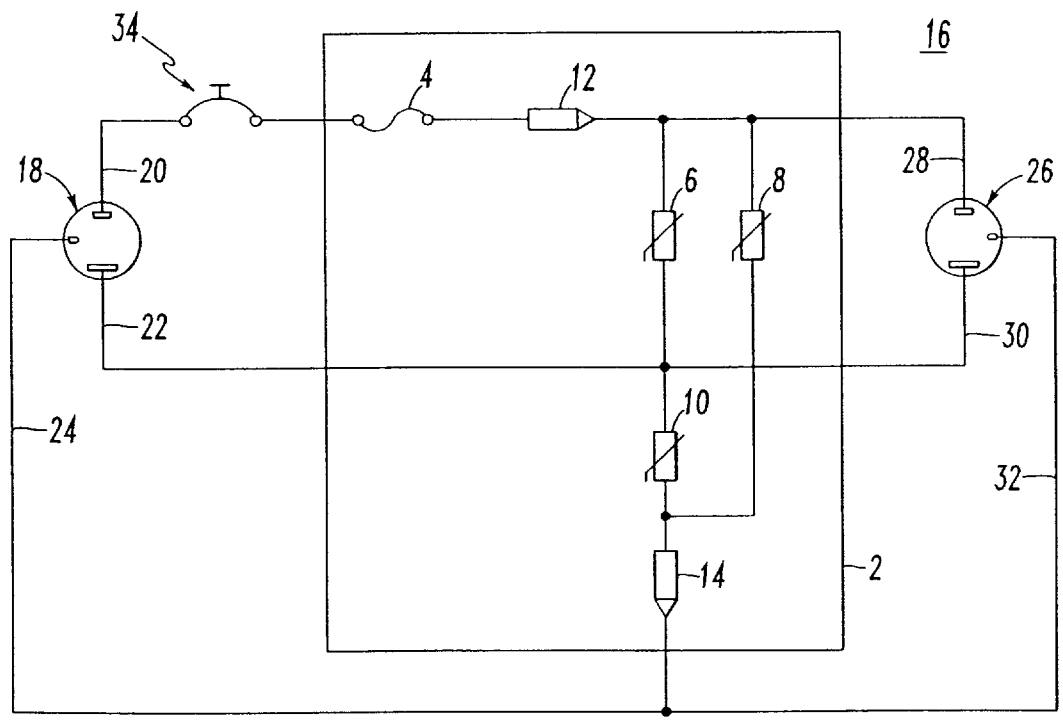
FIG. 1 is a block diagram in schematic form of a surge protection device (SPD) based upon metal oxide varistors (MOVs) which are thermally protected by thermal cut-off (TCO) devices.
Figure 2:
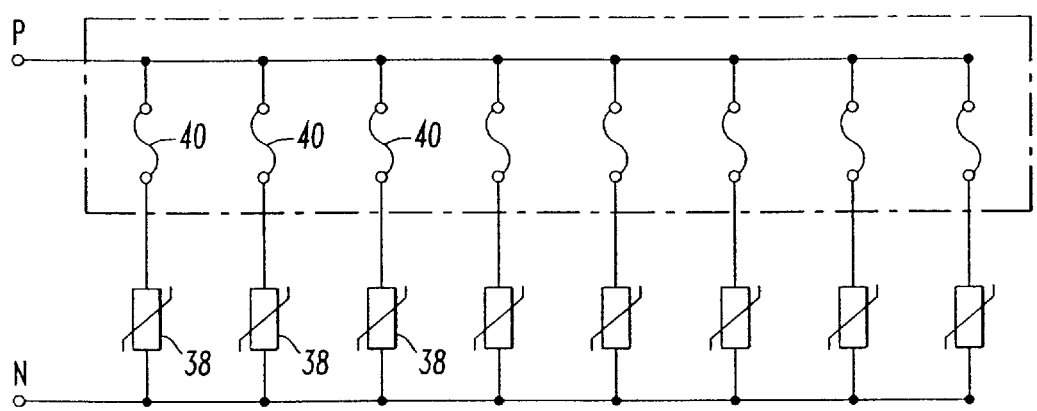
FIG. 2 is a block diagram in schematic form of a SPD based upon metal oxide varistors (MOVs) which are electrically interconnected in parallel and which have individual overcurrent protection.
Figure 3:
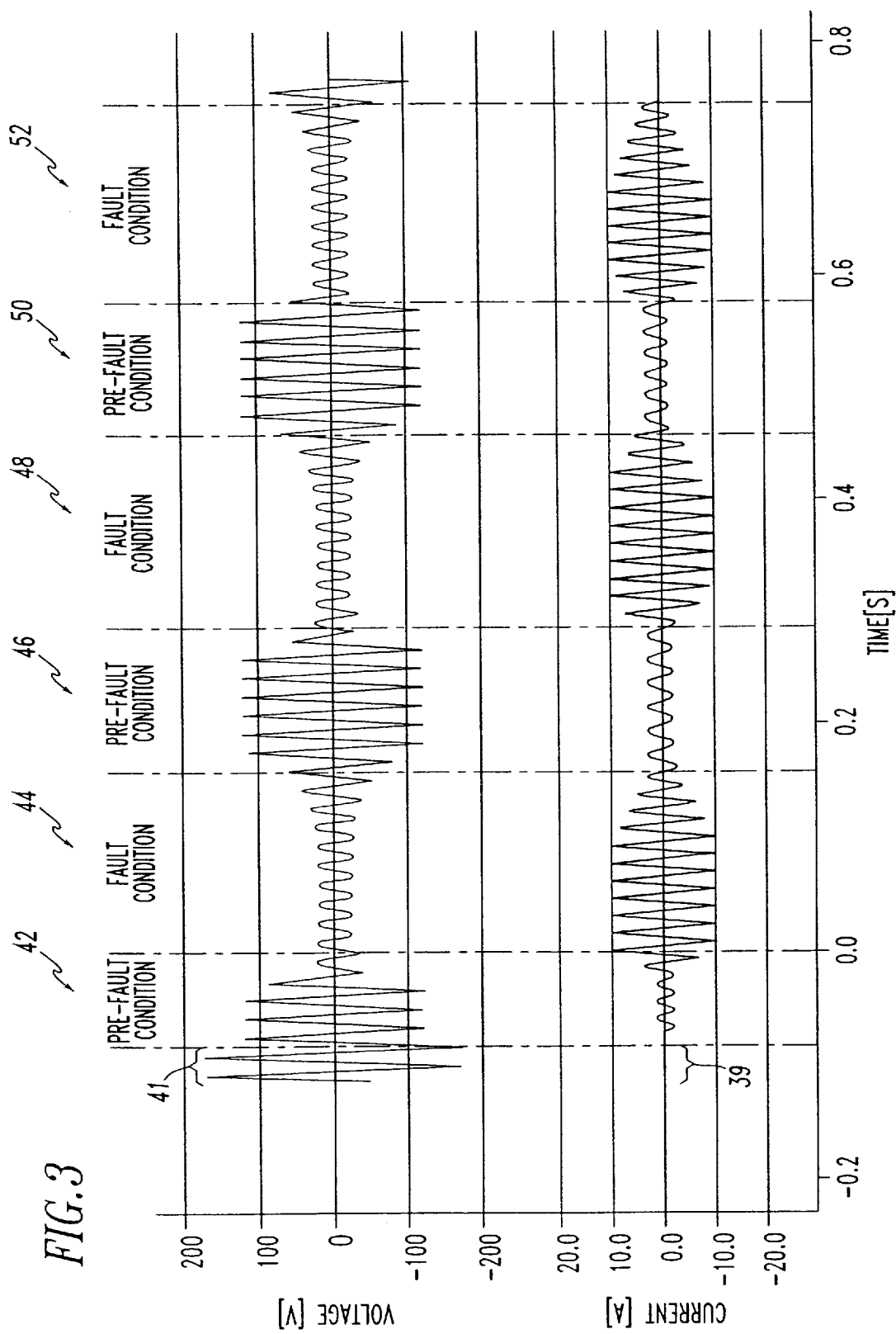
FIG. 3 shows plots of voltage and current versus time for a set of parallel MOVs, which fail one at a time.

FIG. 3 shows plots of abnormal MOV overvoltage and corresponding MOV current during a limited current test of a SPD. In this example, three MOVs are connected in parallel and initially have a nominal leakage current 39 and a nominal system voltage 41. Then, the MOVs are exposed to twice that nominal system voltage. In the pre-fault condition 42, all three MOVs clamp the voltage for several cycles. The exemplary voltage peak of the sine-like waveform is about 100 V and the current peak is about 2 A. Then, beginning at time 0.0 s for the first fault condition 44, one of the MOVs fails and conducts about 10 A peak current before disconnection by a fuse. Next, in the second pre-fault condition 46, the remaining MOVs clamp the voltage at about 100 V peak for several cycles with the current peak being less than 2 A. In the second fault condition 48, one of remaining MOVs heats up and fails with limited current at about 10 A peak for several cycles before it is disconnected by a fuse. Finally, the remaining MOV starts to clamp in the third pre-fault condition 50 and then fails in the third fault condition 52 in the same way.

The cause of fire in SPDs is improper fuse design. The overcurrent fuse for individual MOV protection must meet two requirements. First, an overcurrent fuse must open before the protected MOV catches fire. Second, the fuse must conduct (let through) surge current, which is at least as great as the surge rating of the corresponding MOV.

Changes in the internal MOV structure may lead to a short circuit. Typically, this degradation occurs very gradually, with the MOV resistance changing from several million ohms to much less than one ohm (e.g., several mΩ). This very substantial change provides suitable time to sense the changes and disconnect a failing MOV before a catastrophic SPD failure occurs. In this regard, a crucial problem is that an improperly designed disconnection device would reduce the surge protection capability of the SPD, thereby compromising a primary purpose of the SPD, namely the protection of downstream equipment against surges.

Testing shows that when MOVs are connected in parallel circuits, at certain overvoltage levels, only one MOV at a time fails shorted. This is because, at that moment, the rest of the parallel MOVs have a much higher impedance and, thus, do not conduct significant current levels. Instead, all available current flows through the shorted MOV. Hence, it is desirable to protect each MOV with a separate fuse disconnection device.

Because of known natural characteristics of materials, it is not possible to design the very same overcurrent protection device that is capable of surviving very high surge current and still open at very low fault current. A relatively low fault current rating is desired to prevent catastrophic MOV failure resulting from abnormal overvoltage conditions. Therefore, it is desirable to provide a thermal fusing device in combination with an overcurrent disconnection device in order to protect the MOV whenever the overcurrent protector cannot open.

In accordance with the present invention, the combination of the TFS and the FT perform disconnection of the MOV during fault conditions. Furthermore, at the same time, this combination is designed to conduct normal current without significant heat generation. During normal conditions, the TFS and FT preferably do not exceed thermal or mechanical stress, which would otherwise change the proper functioning of these components. This is accomplished by employing leakage current coordination during the design of these components. Hence, at relatively low fault current conditions (e.g., with a relatively high source impedance), when the short circuit current is limited (e.g., to several amps), then the TFS should react first (i.e., faster then the FT) and disconnect a shorted MOV. However, in the event of about a double abnormal overvoltage condition with relatively very high fault current (e.g., with a relatively low source impedance), then the FT should preferably open before the TFS and disconnect the shorted MOV. Usually, when the FT melts, the adjacent TFS disconnects as well.

Figure 4:
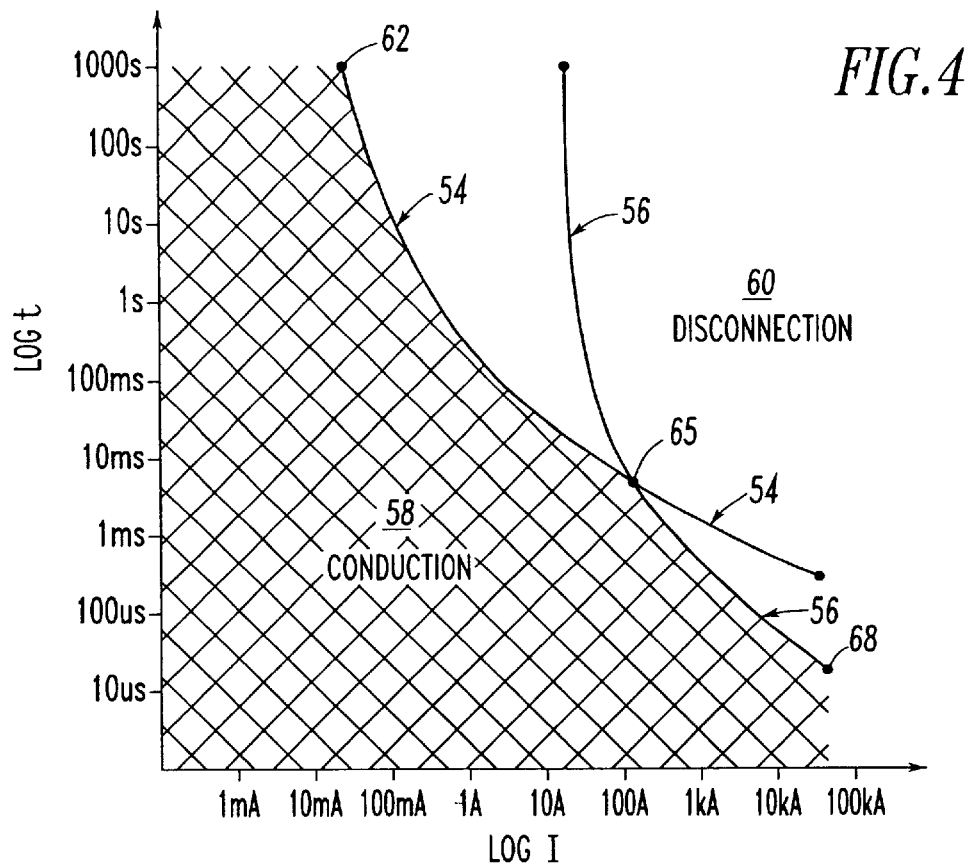
FIG. 4 is a log-log plot showing time versus current for the combination of a MOV, a thermal fuse spring (TFS) and a fuse trace with solder hole (FTWSH) in accordance with an embodiment of the present invention.

FIG. 4 shows two log-log plots 54 and 56 which provide coordinated thermal fusing and overcurrent disconnection, respectively, for a SPD including a combination of a MOV, a thermal fuse spring (TFS) and a fuse trace with solder hole (FTWSH) (as discussed below in connection with FIGS. 5A–5B) in accordance with an embodiment of the present invention. The plot 54 shows log (time (t)) versus log (current (I)) for the combination of the MOV and TFS, while the plot 56 shows log (t) versus log (I) for the FTWSH. A conduction region 58 is shown toward the bottom left of the plots 54,56, while a disconnection region 60 is shown toward the upper right of such plots.

Preferably, both of the TFS and the fuse trace (FT) are designed to withstand relatively very high surges (i.e., in a relatively very short period of time). The thermal fuse spring (TFS) is heated by the MOV and is capable of disconnecting the MOV at fault conditions measured in a relatively low current range (e.g., from about point 62 to about point 65 of plot 54 of FIG. 4). The FT is capable of disconnecting the MOV at fault conditions in a relatively higher current range (e.g., from about point 65 to about point 68 on plot 56 of FIG. 4). The FT alone is insufficient to prevent catastrophic failure of the MOV. Typically, the TFS disconnects a failing MOV. However, in the case of improper installation, for example, when a double abnormal overvoltage might be present at the SPD's input terminals, then the FT disconnects the MOV. At relatively very high fault current conditions, the FT opens the MOV faster than does the TFS. In this manner, the FT improves the AIC rating of the SPD. The TFS and FT cooperatively provide coordinated disconnection of the MOV from the power source under overvoltage (fault) conditions. The exemplary TFS, FTWSH and MOV combination provides suitable disconnection for a wide range of fault currents. Furthermore, it maintains proper surge current ratings, which is termed "surge current coordination".

Referring to FIG. 5A, a SPD 70 includes an exemplary printed circuit board (PCB) 72 and the combination of a MOV 74, a thermal fuse spring (TFS) 76 and a fuse trace with solder hole (FTWSH) 78 in accordance with the present invention. As is well known, the MOV 74 includes leads 80,82, which are inserted in respective through holes 84,86 of the PCB 72. The FTWSH 78 includes PCB copper traces 88,90 and through hole 92. The through hole 92 is positioned between the MOV lead 80 and the TFS foot 104. Preferably, the traces 88,90 are unplated.

During wave-soldering of the PCB 72, the through holes 84,86,92 are filled with solder, such as conventional solder 94 in the through hole 84 and conventional solder 96 (e.g., having a melting temperature of between about 175° C. and about 250° C.) in the through hole 92. In this manner, the MOV leads 80,82 are electrically connected to PCB traces, such as copper traces 90,98 on opposite sides of the through hole 84. Also, the solder 96 fills the through hole 92. The solder 96 is advantageously employed to shorten the disconnection time of the FTWSH 78 under overcurrent conditions by first melting and, then, hastening the disconnection (e.g., by burning) of one or both of the FTWSH PCB copper traces 88,90. For example, a 250° C. solder melting temperature promotes a relatively longer disconnection time, since greater MOV leakage current is required to melt the solder 96 and burn one or both of the traces 88,90. A 175° C. solder melting temperature, for example, promotes a relatively shorter disconnection time, since relatively less MOV leakage current is required to melt the solder 96 and burn one or both of the traces 88,90. Preferably, the burning of the traces 88,90 includes two components: (1) melting of the copper trace(s); and (2) arcing of those copper traces. For example, initially, a surge may not burn the traces and may, instead, be clamped by the MOV. Subsequently, a persistent current may provide sufficient energy to both melt and cause arcing of the copper traces, thereby leading to disconnection of the MOV.

Before the wave-soldering process, the TFS 76 is placed on the PCB 72 during a surface mounting (re-flow) process. Preferably, a fusible alloy, such as a suitably low temperature solder, shown at 100 and 102, is employed at the feet 104,106 of the TFS 76, in order to hold the TFS 76 in a normal stretched position. In this manner, a series electrical connection is established from PCB copper trace 108, to solder 102, to the foot 106 of the TFS 76 and through such TFS to the foot 104, to the solder 100, to the copper trace 88, to the through hole 92, to the copper trace 90, to the through hole 84, to the MOV lead 80 and, thus, to the MOV 74.

During normal operation of the SPD 70, the leakage current through the TFS 76, FTWSH 78 and MOV 74 is in the order of several $\mu$A. There is no significant temperature increase of the MOV 74, FTWSH 78 and TFS 76 during normal conditions. However, during abnormal conditions, the temperature of the MOV 74 rises. In accordance with the invention, the principle of thermal disconnection is to have the fusible alloy, at 100, exposed to the source of heat, namely the MOV 74. The heat, at 110, is transferred through the MOV leg 80 and the copper traces 90,88 (e.g., through the melting and arcing thereof) and through hole 92 of the FTWSH 78 to the low temperature solder 100, which is beneath the foot 104 of the TFS 76. In the exemplary embodiment, once the temperature of the TFS foot 104 reaches about 95° C. (see, for example, FIGS. 12 and 13), the solder 100 sufficiently softens or melts, and the leg 112 of the TFS 76, which leg is biased toward the opposing leg 114, moves thereto as shown at 115. Preferably, the solder 100 sufficiently softens or melts at a temperature of about 80 degrees C. to about 120 degrees C.

In order to handle relatively high surge currents, the FTWSH 78 must have as big of a cross-sectional area as possible, but in order to disconnect a failing MOV in a suitably short time, the FTWSH 78 must have as small of a cross-sectional area as possible. In order to meet these directly conflicting requirements, the combination of the TFS 76 and the FTWSH 78 is employed. Hence, for relatively small fault currents and relatively longer disconnection times (e.g., the exemplary range from point 62 to point 65 of plot 54 of FIG. 4), the TFS 76 disconnects. Again, this is the typical application of the SPD 70. Alternatively, in very rare situations, during relatively high fault currents (e.g., the exemplary range from point 65 to point 68 of plot 56 of FIG. 4), the TFS 76 might not be fast enough to timely and safely disconnect the MOV 74. In that situation, the exemplary fuse trace in the form of the FTWSH 78 provides additional help. For example, if a conventional fuse trace (e.g., as would be provided by the copper traces 88,90 being simply electrically connected in series without the through hole 92) has the same surge current rating as the exemplary FTWSH 78, that FTWSH has a fault current rating which is about half of the fault current rating of the conventional fuse trace. During relatively very high fault currents (e.g., toward the right side of the plot 56 of FIG. 4; resulting from a relatively extremely low power source impedance), only the FTWSH 78 disconnects the MOV 74.

Figure 5B:
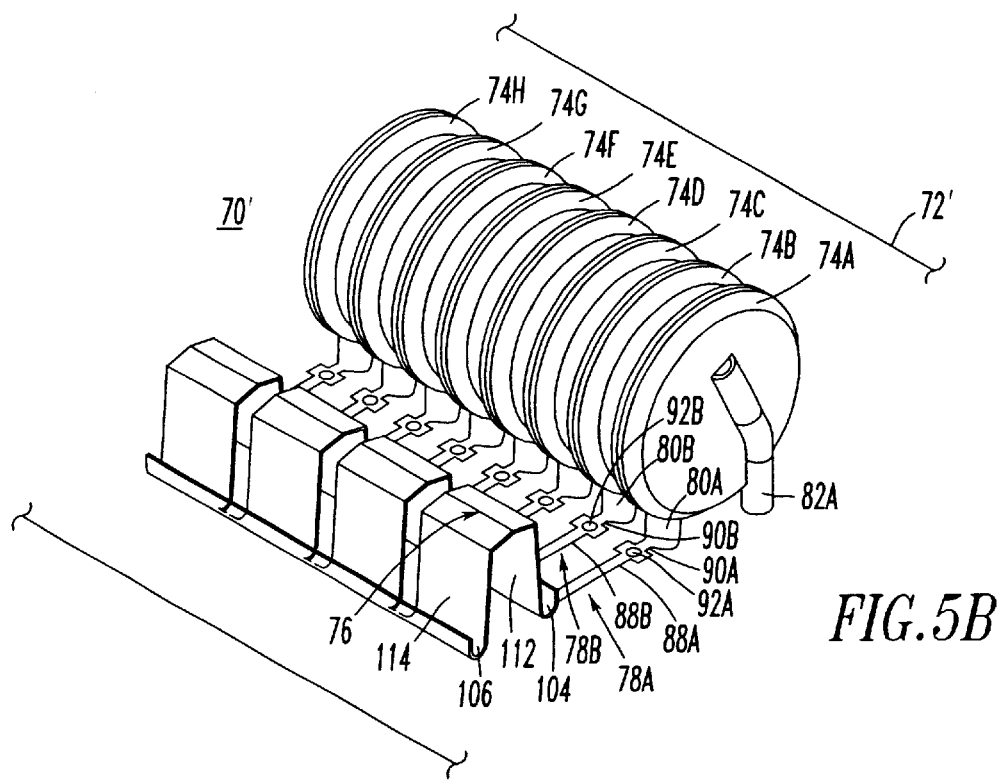
FIG. 5B is an isometric view of a printed circuit board (PCB) SPD, including TFS and FTWSH components, which is similar to the PCB of FIG. 5A, except that two parallel sets of FTWSHs and MOVs are employed with each TFS.

As shown in FIG. 5B, another SPD 70' includes an exemplary printed circuit board (PCB) 72' and the combination of eight MOVs 74A–74H, the exemplary thermal fuse spring (TFS) 76, and eight FTWSH, such as shown by the FTWSH 78A and 78B for the respective MOVs 74A and 74B. The MOV 74A includes the leads 80A and 82A, and the MOV 74B includes two leads (only lead 80B is shown). The FTWSH 78A includes PCB copper traces 88A,90A and through hole 92A, and the FTWSH 78B includes PCB copper traces 88B,90B and through hole 92B. The through holes 92A and 92B are positioned proximate the respective MOV leads 80A and 80B. The exemplary TFS foot 104 is electrically connected to both of the traces 88A,88B. In this manner, the TFS 76 includes 4 TFS members, each of which is electrically connected to two separate series combinations of a FTWSH and an MOV, with both of those FTWSH-MOV series combinations being electrically connected in parallel.

Figure 6:
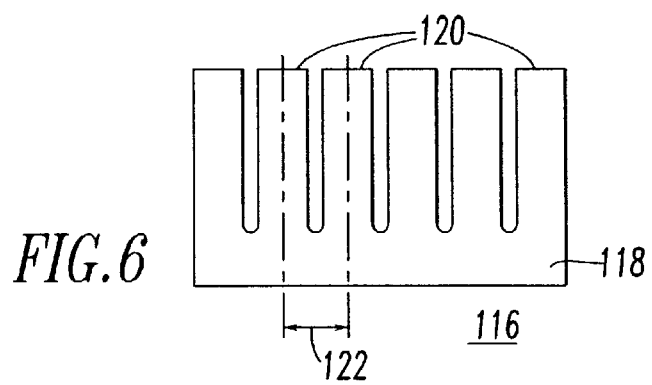
FIG. 6 is a plan view of a cutting of a metal sheet, which is employed in manufacturing a thermal fuse spring (TFS) in accordance with the present invention.

FIG. 6 shows a component 116 for a thermal fuse spring (TFS) in accordance with the present invention. Manufacturing of such a TFS starts with cutting a relatively thin, flexible conductive metal sheet material, which suitably conducts surge current, in the form shown in FIG. 6. The component 116 includes a base 118 and a plurality of fingers 120. In the exemplary embodiment, there is a central distance 122 between adjacent ones of the fingers 120. The distance 122 is preferably selected to match the central distance between a count of six exemplary adjacent MOVs (not shown).

Figures 7A, 7B:
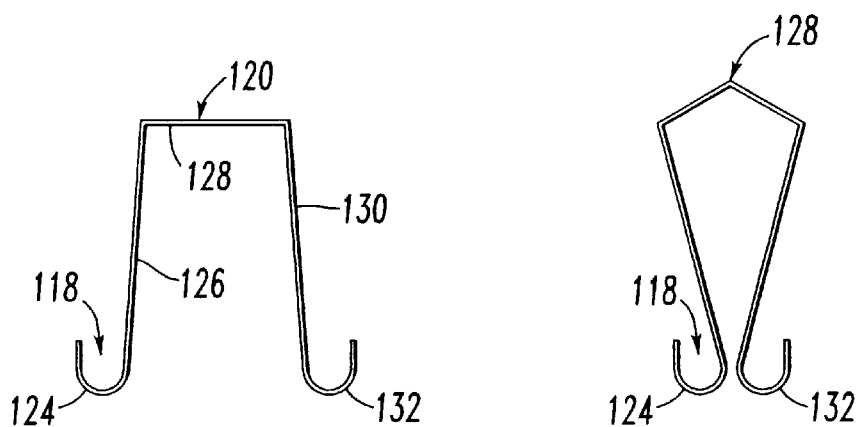
FIGS. 7A–7C show side views of the thermal fuse spring (TFS) component of FIG. 6 during various steps in the manufacturing process in accordance with the present invention.
Figure 7C:
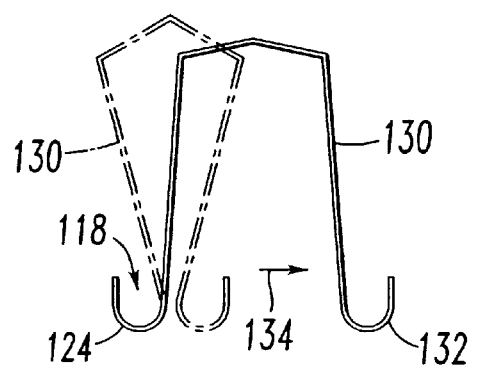

FIGS. 7A–7C show side views of the thermal fuse spring (TFS) component 116 of FIG. 6 during sequential manufacturing steps. Bending of TFS is performed in several steps. First, as shown in FIG. 7A, is the bending of the base 118 and each of the fingers 120 (only one finger 120 is shown). The base 118 is bent to form a first hooked foot 124. The finger 120 is bent three times to form a first leg 126, an upper portion 128, a second leg 130 and a second hooked foot 132. Second, as shown in FIG. 7B, the upper portion 128 is bent to form a spring member and to make the feet 124,132 touch or nearly touch each other. Third, as shown in FIG. 7C, the leg 130 is stretched in the direction 134 in order that the feet 124,132 are suitably displaced for soldering the same to a PCB, such as the PCB 72 of FIG. 5A.

Figure 8A:
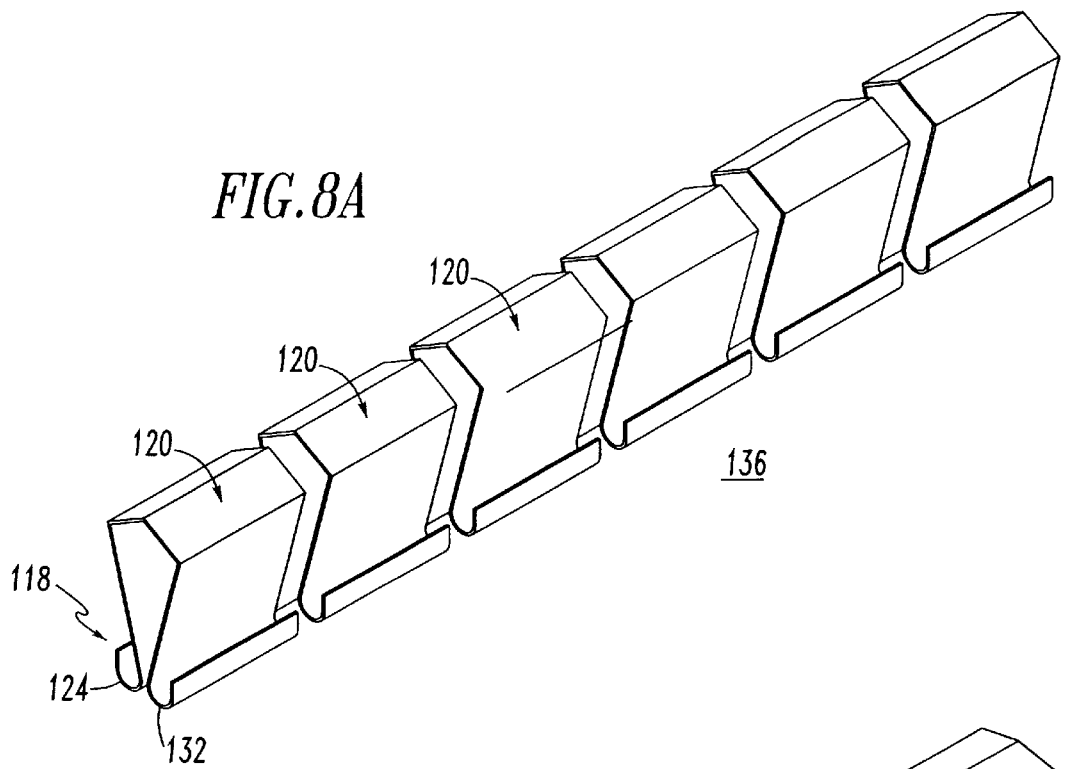
FIGS. 8A and 8B are isometric views of respective un-stretched and stretched thermal fuse springs (TFSs) in accordance with the present invention.
Figure 8B:
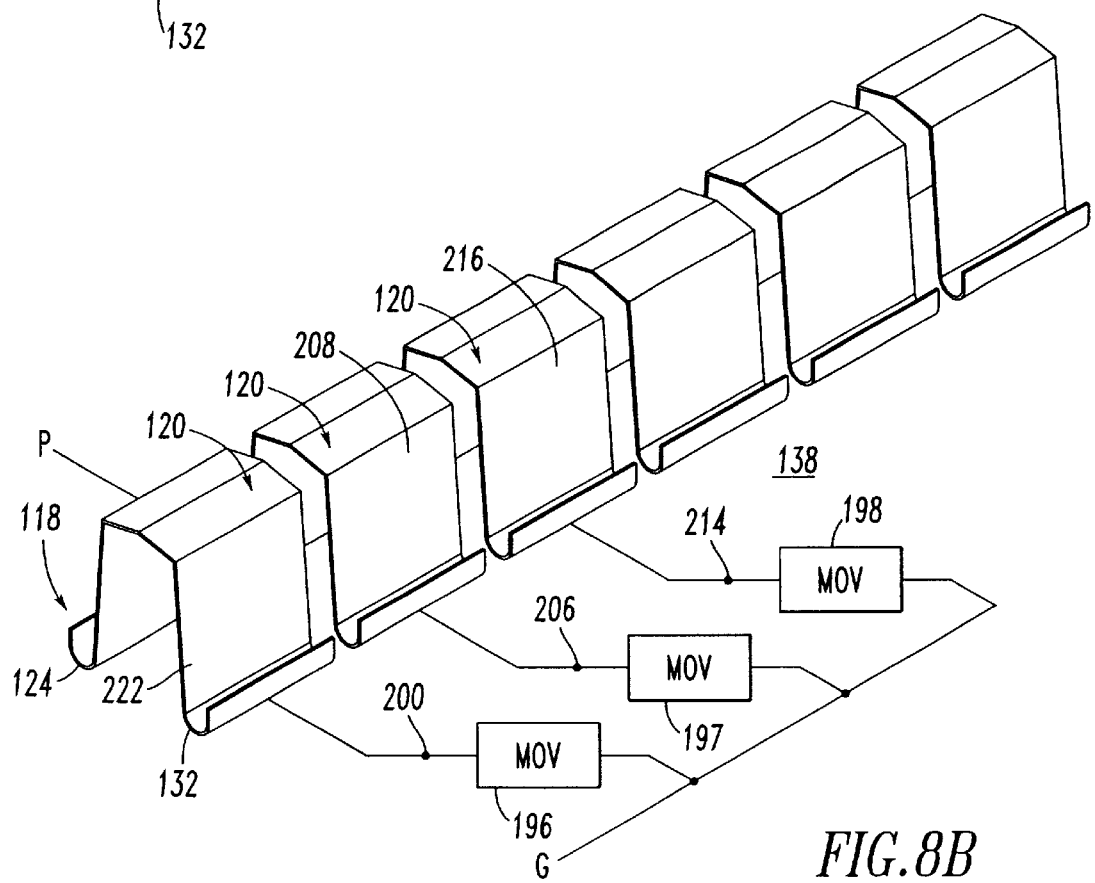

FIGS. 8A and 8B show respective un-stretched 136 and stretched 138 thermal fuse springs (TFSs), which are formed in the manner discussed above in connection with FIGS. 6 and 7A–7C. The un-stretched TFS position 136 is the final stage of manufacturing the TFS before the stretched TFS position 138 is soldered to a PCB (not shown). Although the exemplary TFS 138 has six fingers 120 (each of which is bent to form one of the legs 130) for six MOVs (e.g., MOVs 196,197,198), the present invention is applicable to any count of parallel MOVs (e.g., without limitation, 1, 2, 3–5, 6 or greater). Preferably, the component 116 of FIG. 6 is suitably flexible in order that upon disconnection the stretched TFS position 138 rapidly pulls back to the un-stretched TFS position 136 in order to prevent arcing.

Each of the steps in the assembly of the TFS 136 and soldering of the TFS 138 is preferably selected in view of system (MOV) surge current requirements, TFS fault current requirement, thermal conductivity, spring characteristics, and the electrical characteristics and size of the MOV which is to be protected.

Figure 10:
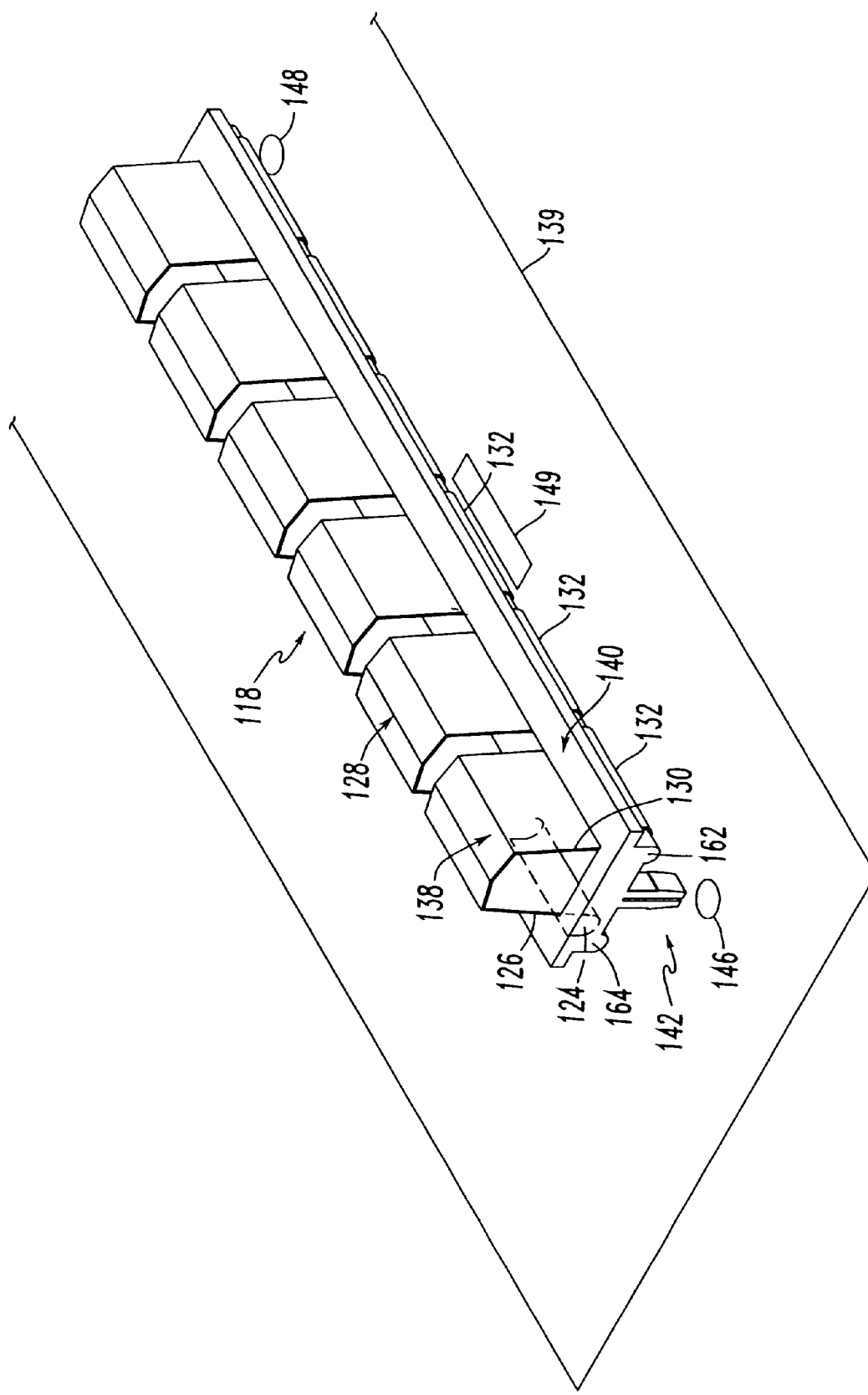
FIG. 10 is an isometric view of the stretching tool of FIG. 9 in combination with the stretched thermal fuse spring (TFS) of FIG. 8B.

Referring to FIGS. 9 and 10, the process of assembling the TFS 136 of FIG. 8A onto a PCB 139 employs a tool, such as the exemplary stretcher device 140, which is employed to mount the stretched TFS 138 of FIG. 8B on the PCB 139 and hold the TFS in place during the surface mounting (re-flow) low temperature soldering process. The position of the TFS 138 on the PCB 139 is defined by two pins 142,144 on the stretcher device 140. The size and shape of holes 146,148 on the PCB 139 suitably match the size and shape of the respective pins 142,144. The position of the holes 146,148 defines, with suitable precision, the position of the TFS 138 and its feet on the PCB 139. This is very important, because the position of such feet determines the characteristics of the low temperature solder joint between the bottom surface of those feet and the copper PCB pad 149 beneath those feet.

The base 118 of the TFS 138 is near the incoming terminal (e.g., phase connector of the SPD) (not shown) for connection to the power source (not shown). The finger side of the TFS 138, as shown by the feet 132, is adjacent to the leg of the MOV (not shown). After the low temperature soldering process is completed, the PCB 139 includes various components (not shown) including the TFS 138. Next, the pins 142,144 are pushed from the bottom side of the PCB 139 and the stretcher device 140 is removed upward from the PCB for a subsequent use. The base foot 124 and the feet 132 (FIG. 8B) of the TFS 138 are suitably held in the proper place on the PCB 139 by the low temperature solder (e.g., 100,102 of FIG. 5A).

As shown in FIGS. 9 and 10, the stretcher device 140 includes a base 150 having first and second ends 152,154, first and second sides 156,158, and an elongated opening 160 in the base 150. A first alignment member, which is the exemplary pin 142, is affixed to the first end 152, and a second alignment member, which is the exemplary pin 144, is affixed to the second end 154. First and second elongated arcuate members 162,164 are affixed to the first and second sides 156,158, respectively. The opening 160 is adapted to receive the spring members 128 of the TFS 136, with the first and second elongated arcuate members 162,164 being adapted to hold the respective hooked foot members 132, 124 with the legs 126,130 being stretched thereapart for engagement with the PCB 139.

Although the exemplary stretcher device 140 is designed for the TFS 136 having six fingers 120 for six MOVs (not shown), the present invention is applicable to any count of fingers for parallel MOVs (e.g., without limitation, 1, 2, 3–5, 6 or greater).

Figure 11B:
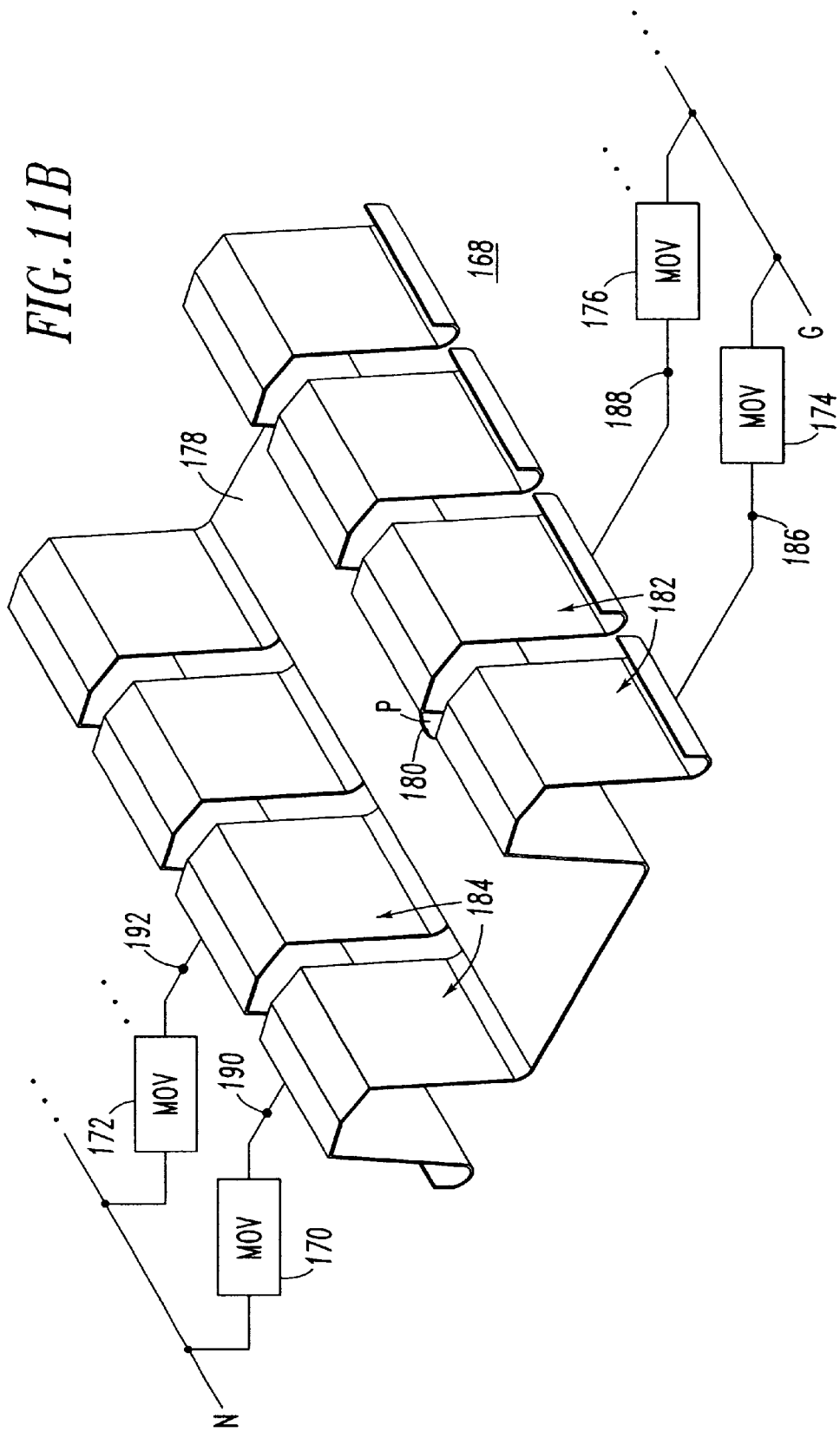

FIGS. 11A and 11B show respective un-stretched and stretched thermal fuse springs (TFSs) 166 and 168, which provide protection of MOVs, such as 170,172,174,176, on both sides of the TFS 168 of FIG. 11B. The TFS 168 includes a middle base portion 178, which has a suitable connection, such as a central opening 180 for a conductive fastener or terminal (not shown), for electrical connection to a phase terminal P. The TFS 168 also includes a plurality of first legs 182 and a plurality of second legs 184. The first legs 182 are electrically interconnected with corresponding fuse traces 186,188 and surge protection circuits, such as the MOVs 174,176, respectively, which are electrically connected to a common ground G. The second legs 184 are electrically interconnected with corresponding fuse traces 190,192 and surge protection circuits, such as the MOVs 170,172, respectively, which are electrically connected to a common neutral N. The exemplary double-sided TFS 168 is, thus, suitable for plural phase-to-ground (P-G) and plural phase-to-neutral (P-N) connections and, hence, provides a practical and cost effective assembly.

In this example, the first leg 182, the fuse trace 186, and the MOV 174 are electrically interconnected in series between the exemplary phase terminal P and the exemplary ground terminal G. Similarly, the second leg 184, the fuse trace 190, and the MOV 170 are electrically interconnected in series between the exemplary phase terminal P and the exemplary neutral terminal N. The three terminals P, N, G are also electrically connected to a suitable power source and to a load.

There are five exemplary different stages or conditions in which the exemplary MOVs, such as MOVs 196,197,198 of FIG. 8B, operate: (1) a normal condition in which there are no or insubstantial voltage disturbances; (2) a relatively small overvoltage condition in which the MOV has a steady state temperature; (3) a pre-fault condition in which the MOV has an increasing temperature; (4) a fault condition; and (5) a surge condition. The normal condition occurs with a nominal system voltage and with no or insubstantial voltage disturbances. Hence, the leakage current through the MOV(s) is negligible and is typically in the order of several μA.

Figure 12:
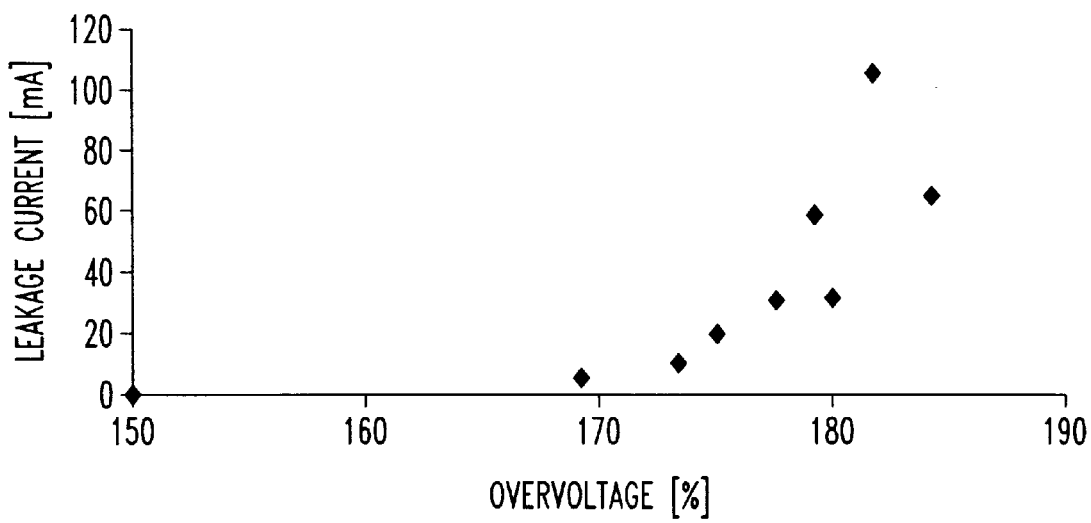
FIG. 12 is a representation of a measured plot of MOV leakage current versus percent overvoltage.

When the MOV voltage starts to rise above the nominal system voltage, the leakage current through the MOV also increases. FIG. 12 shows a plot of MOV leakage current versus percent overvoltage. The MOV leakage current changes with respect to overvoltage as a non-linear function. As shown, a significant increase in the leakage current occurs when the MOV voltage rises above about 170% of nominal system voltage.

Figure 13:
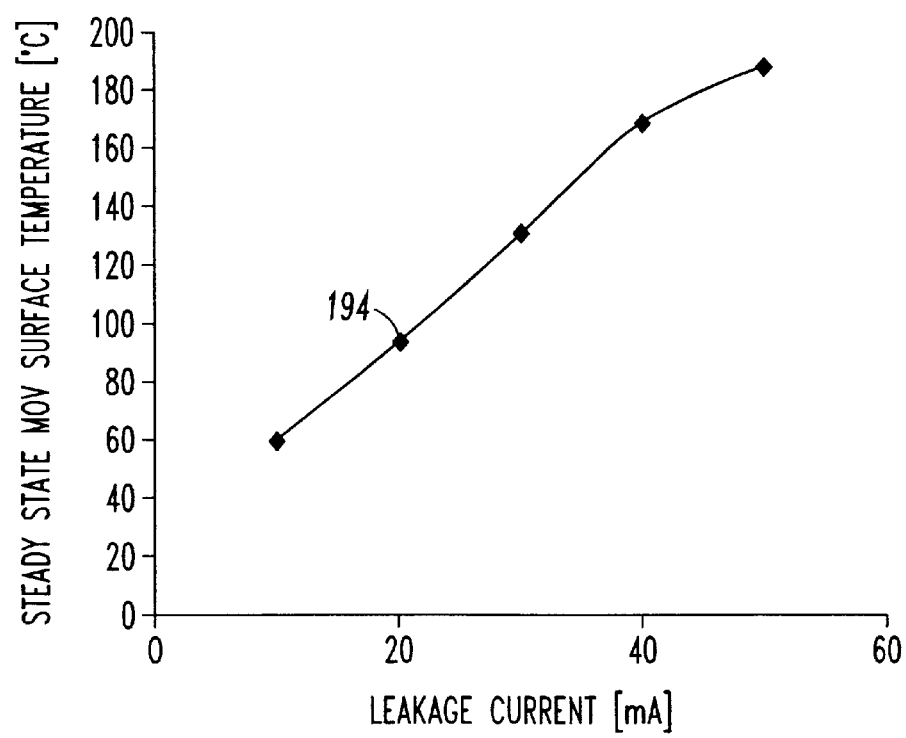
FIG. 13 is a representation of a measured plot of steady state MOV surface temperature versus MOV leakage current.

As the MOV voltage approaches about 170% of the nominal system voltage, the leakage current may increase to one or more mA per MOV. Such a level of leakage current heats the MOV. FIG. 13 shows a plot of steady state MOV surface temperature versus MOV leakage current. By increasing the MOV voltage, higher levels of MOV leakage current are produced. If that leakage current is maintained relatively constant for a sufficient period of time, then the heat generation due to that leakage current (e.g., $I^2R$) and the heat dissipation (e.g., through convection and conduction) become equal, thereby providing a particular steady state temperature, such as at point 194. Similarly, lower or higher levels of controlled leakage current provide lower or higher, respectively, levels of steady state temperature. Nevertheless, if the leakage current is suitably small, then there is no damage to the MOV.

A MOV changes resistance at above a certain temperature (e.g., above 85° C.). Hence, if the MOV voltage is constant, then the MOV conducts more and more leakage current as its temperature rises. If these conditions persist, then it leads into "thermal run-away" of the MOV. This process is irreversible and the damage to the MOV is permanent. If a sufficiently abnormal overvoltage is maintained for a sufficiently long period of time, then permanent damage to the MOV structure builds and the MOV enters a pre-fault condition. Otherwise, if the MOV voltage returns to normal, then the MOV might still function, albeit with changed characteristics (e.g., higher leakage current). In other words, a higher leakage current in the MOV can be described as a reduced value of maximum continuous overvoltage (MCOV). Thus, a partly damaged MOV starts to conduct a significant amount of current at a lower overvoltage as compared to a new or non-damaged MOV. For example, the normal leakage current values shown in FIG. 12 at 170% overvoltage might become several times greater.

Figure 14:
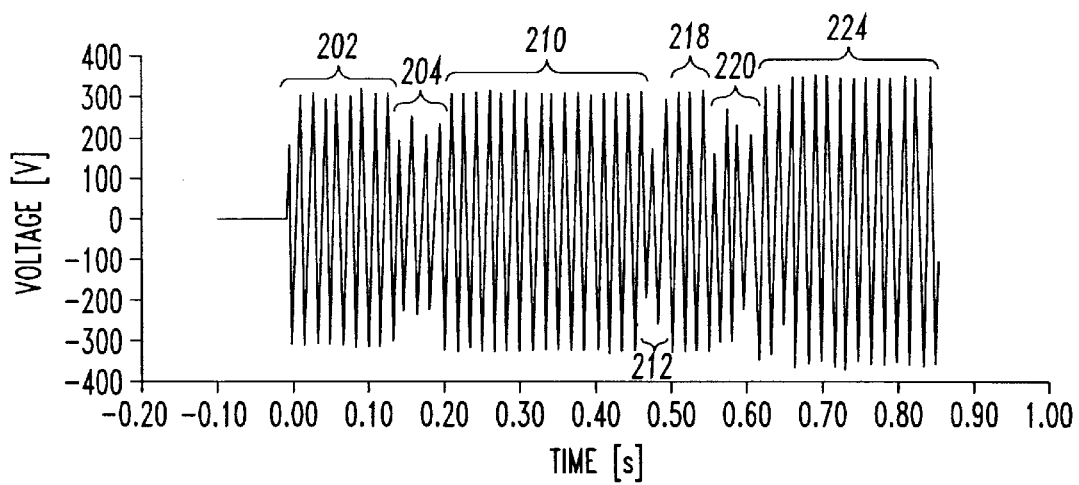
FIG. 14 is a plot of abnormal MOV voltage versus time in which the MOV is thermally and overcurrent fused in accordance with the present invention.
Figure 15:
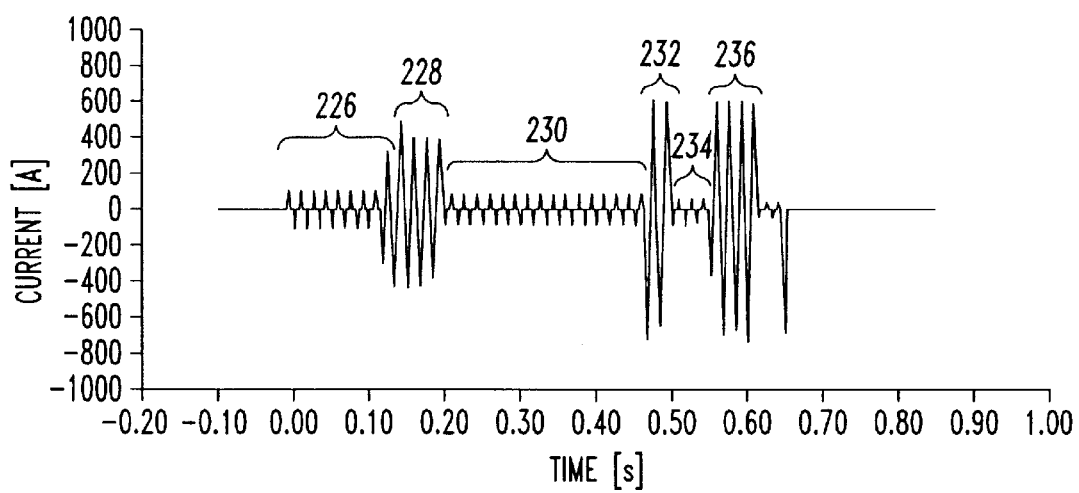
FIG. 15 is a plot of MOV current versus time for the corresponding overvoltage conditions of FIG. 14.

FIG. 14 shows a plot of abnormal MOV voltage versus time in which plural MOVs, such as the MOV 196 of FIG. 8B, is thermally fused by foot 132 of TFS 138 and is overcurrent fused by FTWSH 200. Essentially, a worst case scenario is shown when a double overvoltage (i.e., 200% of nominal system voltage) is applied to the MOVs at time 0.0 s. As an overview, initially, for several cycles, the MOVs are suppressing the overvoltage and the peak voltage is slightly reduced. During that period of time, all of the MOVs are conducting (almost) equal currents. FIG. 15 shows the total current through all of the MOVs. That initial period of time is termed "pre-fault". The next stage is termed "fault". One among the several MOVs is the weakest. Small initial differences between the MOVs become bigger and bigger during the pre-fault conditions. The resistance of the weakest MOV is the smallest and that particular MOV conducts more then the other MOVs. Because that MOV gets hotter, the resistance drops further and increasing levels of current flow through the MOV. In turn, the weakest MOV becomes shorted and almost the entire current flows through only the single MOV.

In this example, which illustrates a MOV failure mechanism, an abnormal overvoltage of about 200% nominal voltage is applied to the phase P and ground G connections to the MOVs 196,197,198 which are connected in parallel. During the first nine cycles 202, these MOVs are clamping at about 190% nominal voltage (e.g., about 300 V peak). This is a pre-fault condition, which increases the temperature of the MOVs. In turn, the weakest MOV (e.g., MOV 197) among the three exemplary MOVs is shorted and the clamping voltage drops down to about 200 V peak. This is the fault condition, which remains for four cycles 204. After that, the failing MOV 197 is disconnected (e.g., by the FTWSH 206 and/or the TFS leg 208) and the remaining MOVs (e.g., MOVs 196,198) are clamping at about 190% nominal voltage for 16 cycles 210 until the next weakest MOV (e.g., MOV 198) fails. The second failure condition lasts for two cycles 212, when the second MOV (e.g., MOV 198) is disconnected (e.g., by the FTWSH 214 and/or the TFS leg 216). The next (and final in this example) pre-fault condition is for three cycles 218, which is followed by a fault condition for the next four cycles 220. At this point, the third MOV (e.g., MOV 196) is disconnected (e.g., by the FTWSH 200 and/or the TFS leg 222). Hence, all three exemplary MOVs are disconnected and the voltage returns to about 200% nominal voltage (e.g., in this example, about 240 $V_{ac} \times 1.41$=about 338 V peak) for the remaining cycles 224.

FIG. 15 shows a plot of MOV current versus time for the corresponding overvoltage conditions of FIG. 14. The amount of current flowing through a shorted MOV depends mostly upon the power source's impedance. For example, the maximum fault current shown in FIG. 15 is about several hundred amperes. The duration of the "fault" depends upon several conditions, with the maximum fault current being the most important. Higher fault current forces the SPD circuitry to degrade at a faster rate. As an overview, the duration of the first fault current on FIG. 15 is about four cycles. The corresponding four cycles of FIG. 14 show a voltage drop during which "fault" the MOV is shorted. Then, after those four cycles, the shorted MOV is disconnected. This is followed by the next "pre-fault" cycles during which the remaining MOVs suppress overvoltage for several cycles. Compared to the first "pre-fault" cycles, the corresponding current is smaller since the number of remaining MOVs has been reduced. Then, each time that another MOV is shorted and disconnected, the total current in the "pre-fault" condition is smaller and smaller, because fewer remaining MOVs are working in parallel. The stages of "prefault" and "fault" conditions are interchangeable (e.g., one sequence of pre-fault condition is followed by one sequence of fault condition, then by a second sequence of pre-fault condition followed by a second sequence of fault condition and so on) until the last MOV is disconnected. At that point, the abnormal voltage returns to full amplitude and the current drops to zero (e.g., after about 0.6 second in FIGS. 14 and 15).

As shown in FIG. 15, the plot includes nine cycles 226 of pre-fault current, four cycles 228 of fault current, 16 cycles 230 of pre-fault current, two cycles 232 of fault current, three cycles 234 of pre-fault current, and four cycles 236 of fault current. The pre-fault current is biggest at the beginning cycles 226, when all three exemplary MOVs 196,197, 198 are clamping. The subsequent pre-fault current cycles at 230 (two MOVs) and 234 (one MOV) have progressively smaller pre-fault currents, because only two MOVs and one MOV, respectively, are in the circuit. Although the pre-fault current is shared among any remaining non-disconnected MOVs, any fault current is (generally) through only one (shorted) MOV.

The process of MOV failure, as discussed above, might be shorter or substantially longer in duration. Such failure depends upon the MOV overvoltage/MCOV ratio, and the count of the parallel MOVs.

Figure 16:
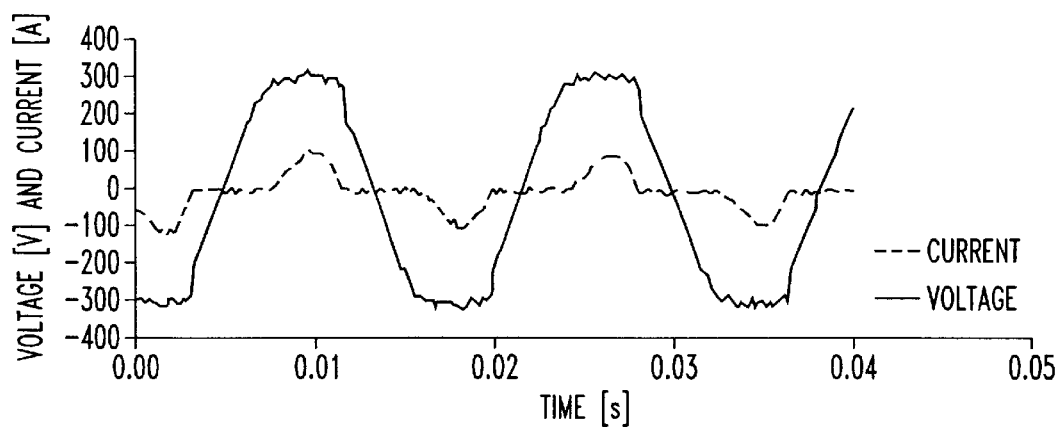
FIG. 16 is a plot of pre-fault abnormal MOV voltage and corresponding current versus time in which parallel MOVs are thermally and overcurrent fused in accordance with the present invention.

FIG. 16 shows a plot of pre-fault abnormal MOV voltage and corresponding current versus time in which parallel MOVs, such as the MOV 196 of FIG. 8B, is thermally fused by foot 132 of TFS 138 and is overcurrent fused by FTWSH 200. These voltage and current plots are from some of the first nine pre-fault cycles 202 (about 0.0 to about 0.04 s) of FIG. 14 and corresponding cycles 226 of FIG. 15. The voltage is shown by a deformed sine wave. The peak of the voltage is about 304 V, instead of the peak abnormal voltage of about 338 V (i.e., 120 V×200%×1.41). At the same time, the peak current is millions times higher than the current at normal conditions.

Figure 17:
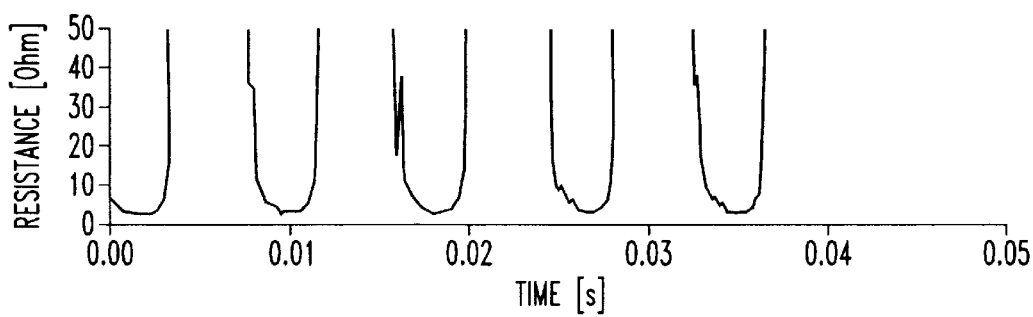
FIG. 17 is a plot of MOV resistance versus time for the corresponding overvoltage conditions of FIG. 16.

FIG. 17 shows a corresponding plot of MOV resistance versus time for the overvoltage conditions of FIG. 16. In this example, the plotted resistance is the parallel resistance of several MOVs (e.g., MOVs 196,197,198). Hence, in order to estimate the resistance of a single MOV, the plotted resistance is multiplied by the count of parallel MOVs. The "pre-fault" resistance of FIG. 17 is significant as compared to a conventional power source impedance. Hence, the "pre-fault" current is limited by MOVs' parallel resistance.

Figure 18:
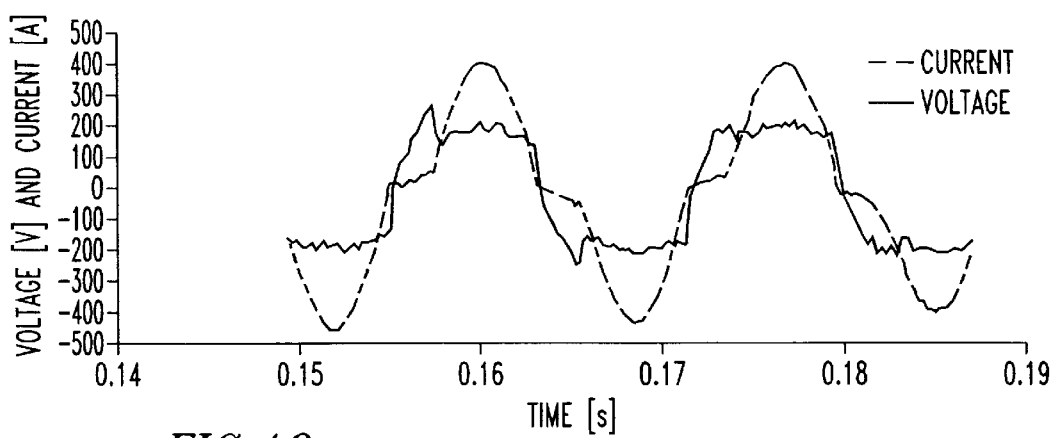
FIG. 18 is a plot of fault condition abnormal MOV voltage and corresponding current for one MOV versus time in which parallel MOVs are thermally and overcurrent fused in accordance with the present invention.

FIG. 18 shows a plot of a fault condition for abnormal MOV voltage and corresponding current versus time in which a MOV, such as the MOV 196 of FIG. 8B, is thermally fused by foot 132 of TFS 138 and is overcurrent fused by FTWSH 200. The time duration shown in FIG. 18 corresponds to about the 0.14 s to 0.20 s time of FIGS. 14 and 15. The peak of the voltage waveform is about 200 V, rather than the peak of the abnormal voltage, namely about 338 V. At the same time, the peak current through one MOV is about 400 A. Furthermore, this value might be several times higher if permitted by the power source impedance, in which a lower source impedance sources a higher fault current. Hence, at this moment, the MOV must be disconnected before it conducts enough energy to cause a catastrophic failure. As shown in FIG. 18, the voltage magnitude is lower and the current magnitude is much larger than the corresponding voltage and current magnitudes during the pre-fault cycles 202 and 226 of FIGS. 14 and 15, respectively. Since this current flows through only a single (shorted) MOV, the amount of heat generated by the MOV is substantial.

Figure 19:
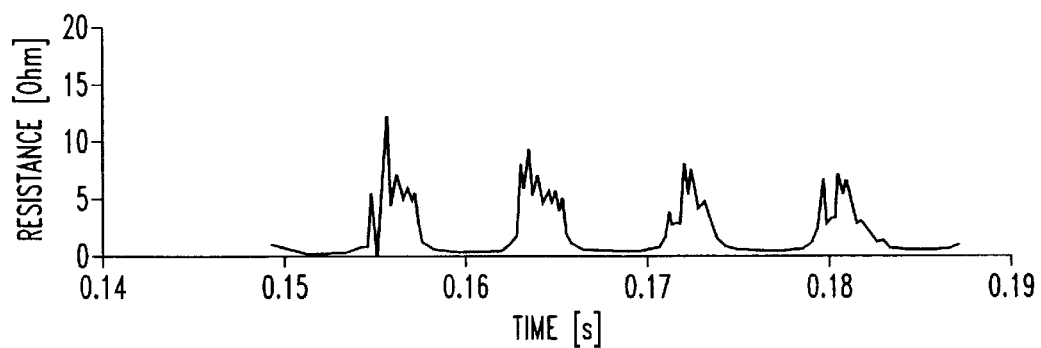
FIG. 19 is a plot of MOV resistance versus time for the corresponding overvoltage conditions of FIG. 18.

FIG. 19 is derived from the fault voltage and fault current of FIG. 18 and shows the resistance of the single (shorted) MOV versus time. An MOV is a non-linear component and the MOV resistance changes between near infinite and about 30Ω. This resistance limits the current through one MOV to below about 5 $A_{rms}$. This current heats the MOV and the temperature rises on all parallel-connected MOVs until the weakest MOV becomes shorted. At that point, the MOV enters a fault condition and the shorted MOV conducts (almost) all of the available current (FIG. 18). As shown in FIG. 19, the shorted MOV resistance is still non-linear and changes in the range from about 0.4 to about 10Ω. This resistance is voltage-dependent as shown by its magnitude being comparable with a common source impedance (e.g., 0.7Ω). If the source impedance is smaller, then the fault current is larger and the time to disconnect a failing MOV must be shorter.

A SPD in accordance with the present invention preferably includes the following for improved catastrophic failure protection: (1) each MOV has a dedicated thermal fuse spring (TFS) combined with a dedicated fuse trace (FTWSH); (2) the TFS and the FTWSH withstand surge current conditions and have a surge current rating which is suitable for letting a surge go through the protected MOV; (3) the TFS, FTWSH and MOV combination is electrically connected in series; (4) during normal conditions, the leakage current through the series connection of the TFS, FTWSH and MOV is in the range of about several $\mu A$; (5) if the leakage current through the MOV rises up to about several mA, then that condition is an abnormal condition leading into failure (e.g., a pre-fault condition); (6) heat for the thermal disconnection device or TFS is provided by the overheated MOV; and (7) the FTWSH employs a through hole filled with solder (e.g., without limitation, conventional solder) in order to shorten the disconnection time during a fault.

Although the MOV 74 of FIG. 5A and the MOVs 74A–74B of FIG. 5B are electrically connected at one side of the respective fuse traces 78 and 78A–78B, the invention is applicable to surge protection devices in which the MOV (e.g., 74 or 74A) is electrically connected at the other side of the TFS and FTWSH or in series between the TFS 76 and the PCB copper trace (e.g., 88 or 88A). The invention is further applicable to such surge protection devices in which the FTWSH is electrically connected to one input terminal (e.g., phase input, ground or neutral input) and the TFS is electrically connected to another input terminal (e.g., ground or neutral input, phase input) of those devices.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of invention which is to be given the full breadth of the claims appended and any and all equivalents thereof.

What is claimed is:

1. A surge protection device for a load supplied with at least one voltage from a power source, said surge protection device comprising:

at least two terminals adapted to receive said voltage; and
a plurality of surge protection circuits, each of said surge protection circuits comprising:
a thermal fuse spring,
at least one means for clamping a voltage, and
at least one fuse trace, each one of said at least one fuse trace corresponding to one of said at least one means for clamping a voltage,
with said thermal fuse spring, one of said at least one fuse trace and a corresponding one of said at least one means for clamping a voltage being electrically interconnected in series between said terminals, in order to form at least one series electrical connection between said terminals,
with said thermal fuse spring being adapted to disconnect said at least one series electrical connection between said terminals under first fault conditions of said at least one means for clamping a voltage, said first fault conditions including a first current through one of said at least one means for clamping a voltage for a first duration,
with said thermal fuse spring and said at least one fuse trace being adapted to cooperatively disconnect a corresponding one of said at least one series electrical connection between said terminals under second fault conditions of said at least one means for clamping a voltage, said second fault conditions including a second current through one of said at least one means for clamping a voltage for a second duration,
with said second current being greater than said first current,
with said first duration being greater than said second duration, and
wherein said thermal fuse spring comprises a base and a plurality of legs, with said base being electrically interconnected with one of said terminals and said legs; wherein said at least one fuse trace includes a plurality of fuse traces; wherein said at least one means for clamping a voltage includes a plurality of means for clamping a voltage; and wherein each of said legs is electrically interconnected with a corresponding pair of one of said fuse traces and one of said plurality of means for clamping a voltage.

2. A surge protection device for a load supplied with at least one voltage from a power source, said surge protection device comprising:

at least two terminals adapted to receive said voltage; and
a plurality of surge protection circuits, each of said surge protection circuits comprising:
a thermal fuse spring,
at least one means for clamping a voltage, and
at least one fuse trace, each one of said at least one fuse trace corresponding to one of said at least one means for clamping a voltage,
with said thermal fuse spring, one of said at least one fuse trace and a corresponding one of said at least one means for clamping a voltage being electrically interconnected in series between said terminals, in order to form at least one series electrical connection between said terminals,
with said thermal fuse spring being adapted to disconnect said at least one series electrical connection between said terminals under first fault conditions of said at least one means for clamping a voltage, said first fault conditions including a first current through one of said at least one means for clamping a voltage for a first duration,
with said thermal fuse spring and said at least one fuse trace being adapted to cooperatively disconnect a corresponding one of said at least one series electrical connection between said terminals under second fault conditions of said at least one means for clamping a voltage, said second fault conditions including a second current through one of said at least one means for clamping a voltage for a second duration,
with said second current being greater than said first current,
with said first duration being greater than said second duration, and
wherein said terminals include a phase input, a neutral input, and a ground input; and wherein said at least one means for clamping a voltage includes a plurality of first metal oxide varistors between said phase input and said neutral input, and a plurality of second metal oxide varistors between said phase input and said ground input.

3. The surge protection device of claim 2 wherein each of said surge protection circuits is a plurality of first surge protection circuits and a plurality of second surge protection circuits, with each of said first surge protection circuits being electrically connected in parallel, and with each of said second surge protection circuits being electrically connected in parallel; wherein said thermal fuse springs comprise a base, a plurality of first legs and a plurality of second legs, with said base being electrically interconnected with said phase input, with each of said first legs being electrically interconnected with a corresponding pair of said fuse traces, and with each of said second legs being electrically interconnected with a corresponding pair of said fuse traces.

4. A surge protection device for a load supplied with at least one voltage from a power source, said surge protection device comprising:

at least two terminals adapted to receive said voltage; and
a plurality of surge protection circuits, each of said surge protection circuits comprising:
a thermal fuse spring,
at least one means for clamping a voltage, and
at least one fuse trace, each one of said at least one fuse trace corresponding to one of said at least one means for clamping a voltage,
with said thermal fuse spring, one of said at least one fuse trace and a corresponding one of said at least one means for clamping a voltage being electrically interconnected in series between said terminals, in order to form at least one series electrical connection between said terminals,
with said thermal fuse spring being adapted to disconnect said at least one series electrical connection between said terminals under first fault conditions of said at least one means for clamping a voltage, said first fault conditions including a first current through one of said at least one means for clamping a voltage for a first duration, with said thermal fuse spring and said at least one fuse trace being adapted to cooperatively disconnect a corresponding one of said at least one series electrical connection between said terminals under second fault conditions of said at least one means for clamping a voltage, said second fault conditions including a second current through one of said at least one means for clamping a voltage for a second duration, with said second current being greater than said first current, with said first duration being greater than said second duration, wherein said thermal fuse spring includes a first spring member, which is electrically connected to one of said terminals, and a second spring member; wherein said at least one fuse trace is a fuse trace having an input, which is electrically connected to said second spring member, and an output; and wherein said means for clamping a voltage has a first lead, which is electrically connected to the output of said fuse trace, and a second lead, which is electrically connected to another one of said terminals, and wherein said surge protection circuits include a printed circuit board; and wherein said fuse trace includes a first conductive trace on said printed circuit board, a conductive through hole in said printed circuit board, and a second conductive trace on said printed circuit board, with said first conductive trace being electrically connected to the input of said fuse trace and to said conductive through hole, and with said second conductive trace being electrically connected to said conductive through hole and to the output of said fuse trace.

5. The surge protection device of claim 4 wherein the conductive through hole of said fuse trace is filled with solder, in order to shorten a disconnection time of said fuse trace during an overcurrent condition.

6. The surge protection device of claim 5 wherein said solder has a melting temerature of between about 175 degrees C. and about 250 degrees C.

7. The surge protection device of claim 6 wherein said at least one means for clamping a voltage has a fault current rating; and wherein the fault current rating of said fuse trace is less than the fault current rating of said at least one means for clamping a voltage.

8. A surge protection device for a load supplied with at least one voltage from a power source, said surge protection device comprising:

at least two terminals adapted to receive said voltage; and a plurality of surge protection circuits, each of said surge protection circuits comprising:

a thermal fuse spring, at least one means for clamping a voltage, and at least one fuse trace, each one of said at least one fuse trace corresponding to one of said at least one means for clamping a voltage, with said thermal fuse spring, one of said at least one fuse trace and a corresponding one of said at least one means for clamping a voltage being electrically interconnected in series between said terminals, in order to form at least one series electrical connection between said terminals, with said thermal fuse spring being adapted to disconnect said at least one series electrical connection between said terminals under first fault conditions of said at least one means for clamping a voltage, said first fault conditions including a first current through one of said at least one means for clamping a voltage for a first duration, with said thermal fuse spring and said at least one fuse trace being adapted to cooperatively disconnect a corresponding one of said at least one series electrical connection between said terminals under second fault conditions of said at least one means for clamping a voltage, said second fault conditions including a second current through one of said at least one means for clamping a voltage for a second duration, with said second current being greater than said first current, with said first duration being greater than said second duration, wherein said thermal fuse spring includes a first spring member, which is electrically connected to one of said terminals, and a second spring member; wherein said at least one fuse trace is a fuse trace having an input, which is electrically connected to said second spring member, and an output; and wherein said means for clamping a voltage has a first lead, which is electrically connected to the output of said fuse trace, and a second lead, which is electrically connected to another one of said terminals, and wherein said surge protection circuits include a printed circuit board having a first conductor which is electrically connected to one of said terminals, and a second conductor which is electrically interconnected with the input of said fuse trace; wherein the first spring member of said thermal fuse spring is soldered to the first conductor of said printed circuit board and the second spring member of said thermal fuse spring is stretched away from said first spring member and soldered to the second conductor of said printed circuit board.

9. The surge protection device of claim 8 wherein the first and second spring members of said thermal fuse spring are each soldered to said printed circuit board with a solder having a melting temperature of about 80 degrees C. to about 120 degrees C.

10. The surge protection device of claim 9 wherein said printed circuit board includes a conductive through hole which is part of said fuse trace; and wherein said conductive through hole is filled with solder having a melting temperature of between about 175 degrees C. and about 250 degrees C., in order to shorten a disconnection time of said fuse trace during an overcurrent condition.

11. The surge protection device of claim 10 wherein each of said thermal fuse spring and said fuse trace has a time versus current characteristic which is coordinated with said at least one means for clamping a voltage in order to disconnect said at least one means for clamping a voltage from said voltage of said power source under overvoltage conditions; wherein the time versus current characteristic of said thermal fuse spring is adapted for disconnection of said means for clamping a voltage from said voltage under a first fault current flowing through said means for clamping a voltage; and wherein the time versus current characteristic of said fuse trace is adapted for disconnection of said means for clamping a voltage from said voltage under a second fault current flowing through said means for clamping a voltage, with said second fault current being greater than said first fault current.

12. A stretcher device for use in mounting at least one thermal fuse spring on a printed circuit board, said thermal fuse spring including a spring member having a pair of legs each of which has a hooked foot member, said stretcher device comprising:

a base including first and second ends, first and second sides, and an elongated opening in said base;

a first alignment member affixed to the first end of said base;

a second alignment member affixed to the second end of said base;

a first elongated arcuate member affixed to the first side of said base; and a second elongated arcuate member affixed to the second side of said base, with the opening of said base adapted to receive the spring member of said thermal fuse spring, and with said first and second elongated arcuate members adapted to hold the hooked foot members of said thermal fuse spring with the legs thereof being stretched thereapart for engagement with said printed circuit board.

13. The stretcher device of claim 12 wherein said at least one thermal fuse spring is a plurality of thermal fuse springs; and wherein each of said first and second elongated arcuate members is adapted to hold a plurality of the hooked foot members of said thermal fuse springs.

14. A surge protection device for a load supplied with a voltage from a power source, said surge protection device comprising:

a plurality of terminals adapted to receive said voltage;

a printed circuit board; and a plurality of surge protection circuits, each of said surge protection circuits comprising:
a thermal fuse spring on said printed circuit board,
means for clamping a voltage,
a fuse trace electrically interconnected in series with said thermal fuse spring and said means for clamping a voltage between said terminals, in order to form a series electrical connection between said terminals, said fuse trace including at least one conductive trace on said printed circuit board and also including a conductive through hole in said printed circuit board and electrically connected to said at least one conductive trace, and with said thermal fuse spring being adapted to disconnect said series electrical connection between said terminals under first fault conditions of said means for clamping a voltage, and with said thermal fuse spring and said fuse trace being adapted to cooperatively disconnect said series electrical connection between said terminals under second fault conditions of said means for clamping a voltage.

15. The surge protection device of claim 14 wherein said conductive through hole is filled with solder having a melting temperature of between about 175 degrees C. and about 250 degrees C., in order to shorten a disconnection time of said at least one conductive trace during an overcurrent condition.

16. The surge protection device of claim 15 wherein said thermal fuse spring includes a first spring member electrically interconnected with one of said terminals and a second spring member electrically interconnected with said fuse trace, with at least one of said first and second spring members being soldered to said printed circuit board with a solder having a melting temperature of about 80 degrees C. to about 120 degrees C.

17. The surge protection device of claim 14 wherein the conductive through hole of said fuse trace is filled with solder, in order to shorten a disconnection time of said at least one conductive trace during an overcurrent condition.

18. The surge protection device of claim 14 wherein said thermal fuse spring and said fuse trace cooperatively provide coordinated disconnection of said means for clamping a voltage from said voltage of said power source under predetermined overvoltage conditions of said means for clamping a voltage.

* * * * *